(12) United States Patent
Kobayashi et al.

(10) Patent No.: US 8,680,424 B2
(45) Date of Patent: *Mar. 25, 2014

(54) MICROWAVE PLASMA PROCESSING DEVICE

(75) Inventors: Akira Kobayashi, Yokohami (JP); Kouji Yamada, Yokohama (JP); Hideo Kurashima, Yokohama (JP); Tsunehisa Namiki, Yokohama (JP); Takeshi Aihara, Yokohama (JP); Yasunori Onozawa, Yokohama (JP)

(73) Assignee: Toyo Seikan Kaisha, Ltd., Tokyo (JP)

( * ) Notice: Subject to any disclaimer, the term of this patent is extended or adjusted under 35 U.S.C. 154(b) by 649 days.

This patent is subject to a terminal disclaimer.

(21) Appl. No.: 12/457,497

(22) Filed: Jun. 12, 2009

(65) Prior Publication Data

US 2009/0250444 A1  Oct. 8, 2009

Related U.S. Application Data

(63) Continuation of application No. 10/546,283, filed as application No. PCT/JP2004/003202 on Mar. 11, 2004, now Pat. No. 7,582,845.

(30) Foreign Application Priority Data

| Mar. 12, 2003 | (JP) | ................. | 2003-066911 |
| Apr. 4, 2003 | (JP) | ................. | 2003-101616 |
| Apr. 10, 2003 | (JP) | ................. | 2003-106517 |
| May 8, 2003 | (JP) | ................. | 2003-130761 |
| Aug. 21, 2003 | (JP) | ................. | 2003-297272 |

(51) Int. Cl.
*B23K 10/00* (2006.01)

(52) U.S. Cl.
USPC ............ 219/121.43; 219/121.52; 219/121.41

(58) Field of Classification Search
CPC ........................................ B23K 10/00
USPC ........... 219/121.36, 121.41–121.47; 427/569, 427/575, 577, 578, 595, 237, 249.1, 294, 427/296
See application file for complete search history.

(56) References Cited

U.S. PATENT DOCUMENTS

| 6,376,028 B1 | 4/2002 | Laurent et al. |
| 6,582,778 B2 | 6/2003 | Namiki et al. |

(Continued)

FOREIGN PATENT DOCUMENTS

| DE | 43 18 086 A1 | 12/1994 |
| JP | 2000-255579 A | 9/2000 |

(Continued)

OTHER PUBLICATIONS

European Patent Office, "European Search Report for EP 12 16 1819", Dec. 11, 2012.

(Continued)

*Primary Examiner* — Brian Jennison
(74) *Attorney, Agent, or Firm* — Manabu Kanesaka

(57) ABSTRACT

A microwave plasma processing device includes a fixing device for fixing a substrate as a processing target on a central axis in a plasma processing chamber, a exhausting device for depressurizing an inside and outside of the substrate, a metal processing gas supply member which is present in the substrate and forms a reentrant cylindrical resonating system along with the plasma processing chamber, and a microwave introducing device for introducing a microwave into the plasma processing chamber to perform processing. A microwave sealing member is provided at a substrate-holding portion of the fixing device, and a connection position of the microwave introducing device is located at a node of an electric field intensity distribution formed on the processing gas supply member by introducing the microwave.

6 Claims, 12 Drawing Sheets

(56) References Cited

U.S. PATENT DOCUMENTS

| | | | |
|---|---|---|---|
| 6,952,949 B2 * | 10/2005 | Moore et al. | 73/38 |
| 7,582,845 B2 * | 9/2009 | Kobayashi et al. | 219/121.43 |
| 2003/0097986 A1 * | 5/2003 | Moore et al. | 118/722 |
| 2003/0157345 A1 * | 8/2003 | Beldi et al. | 428/447 |

FOREIGN PATENT DOCUMENTS

| | | | |
|---|---|---|---|
| WO | WO 97/44503 A1 | 11/1997 | |
| WO | WO 99/17334 A1 | 4/1999 | |
| WO | WO 01/37312 A1 | 5/2001 | |
| WO | WO 02/09891 A1 | 2/2002 | |

OTHER PUBLICATIONS

European Patent Office, "Extended European Search Report for EP 12 16 1825", Oct. 7, 2013.

Juergen Weichart et al., "Beschichtung von dreidimensionalen Substraten mit einem . . . ", Vakuum in der Praxis, Weinheim, DE, vol. 3, No. 1, Feb. 1, 1991, pp. 22-26.

* cited by examiner

FILM THICKNESS DIFFERENCE BETWEEN LONG SIDE DIRECTION AND SHORT SIDE DIRECTION

MICROWAVE PLASMA PROCESSING DEVICE

CROSS REFERENCE TO RELATED APPLICATION

This is a continuation application of patent application Ser. No. 10/546,283 filed on Aug. 22, 2005, which is based on PCT/JP2004/003202 filed Mar. 11, 2004.

BACKGROUND OF THE INVENTION AND RELATED ART STATEMENT

The present invention relates to a microwave plasma processing device, and more particularly to a microwave plasma processing device which can stably and efficiently generate plasma when forming a chemical vapor deposition film to a plastic container.

A chemical vapor deposition method (CVD) is a technique which separates out a reaction product in the form of a film on a surface of a processing target by vapor phase epitaxy in a high-temperature atmosphere using a processing gas which causes no reaction at an ordinary temperature, and is widely adopted in manufacture of a semiconductor, surface property modification of a metal or ceramic, and others. In recent years, in the CVD, especially low-pressure plasma CVD has been applied to surface property modification of a plastic container, and an improvement in gas barrier properties in particular.

The plasma CVD performs thin-film growth by utilizing plasma, and it is basically a method which causes in a vapor phase or on a processing target a chemical reaction of a substance generated from dissociation and coupling by discharging a gas containing a processing gas by using an electrical energy of a high electric field under a reduced pressure, thereby depositing the substance on the processing target.

A plasma state is realized by glow discharge, corona discharge and arc discharge and, as types of glow discharge in these discharge schemes, there are known a method utilizing direct-current glow discharge, a method utilizing high-frequency glow discharge, a method utilizing microwave discharge and others.

As an example of forming a vapor disposition carbon film on plastic by utilizing high-frequency glow discharge, there has been disclosed a carbon film coated plastic container having a hard carbon film formed on an inner wall surface of the plastic container.

In the plasma CVD utilizing high-frequency glow discharge, however, since a so-called capacitive coupling type CVD device in which an internal electrode is arranged in a container and an external electrode is arranged outside the container must be used, there is a problem that a configuration of the device becomes complicated and the operation is also complicated.

On the contrary, in microwave plasma CVD, since microwave discharge in a chamber is utilized, the arrangement of an external electrode or an internal electrode is unnecessary, and a configuration of a device can be very simplified. Further, in regard to a level of depressurization in the device, since producing microwave discharge in a plastic container only can suffice, the inside of the entire device does not have to be maintained in a high vacuum state, and this method is superior in the simplicity of the operation and the productivity.

Microwave discharge plasma is plasma which is superior in the efficiency of generation of high-energy electrons, and is useful for the plasma CVD as high-density and high-reactivity plasma.

As a microwave plasma processing method and device aiming at a plastic container, there has been disclosed a method by which a bottle is coaxially arranged in a cylindrical microwave trapping chamber to simultaneously ventilate the inside and outside of the bottle, a processing gas is caused to flow into the bottle for a predetermined processing time, microwaves are introduced into the microwave trapping chamber and plasma is ignited and maintained in the bottle, thereby processing the bottle.

When the microwave plasma processing is utilized, however, since there is a time lag between introduction of microwaves and generation of plasma and this time lag is not fixed and greatly fluctuates in accordance with each processing, there is a drawback that controlling processing conditions is difficult and the effect of processing is unstable.

Furthermore, since the state of plasma is unstable, there is a problem that a container to be processed is locally subjected to thermal deformation or a uniform thin film cannot be formed.

Here, although a method using an electrical spark, a method based on ultraviolet ray irradiation, a method based on a magnetic field operation and others are known as the plasma ignition method, any method has a problem that a configuration of a device becomes complicated.

Moreover, although ignition of plasma can be hastened by increasing an output of a microwave which is introduced into a plasma processing chamber, since processing using plasma with a high energy is carried out from a vapor deposition initial stage when the output of the microwave is increased, an intermediate layer formed between a target substrate to be processed and a vapor deposition film does not sufficiently grow, thereby reducing the adhesion between the target substrate to be processed and the vapor deposition film.

In order to solve the above-described problems, it is an object of the present invention to provide a microwave plasma processing device and a plasma processing gas supply member which can form a uniform thin film on a target substrate to be processed by uniformly forming a processing is gas into plasma with excellent energy efficiency, reduce a time from introduction of a microwave into a plasma processing chamber to plasma emission, and control a timing of ignition of plasma.

Further objects and advantages of the invention will be apparent from the following description of the invention.

SUMMARY OF THE INVENTION

In order to solve this problem, as a result of dedication to studies, the present inventors have discovered that a uniform thin film can be formed on a processing target with good energy efficiency by providing a microwave sealing member to a predetermined position of a substrate-holding portion of fixing means, specifying a length of a processing gas supply member with this position being used as a reference, and specifying a connection position of microwave introducing means, and they have brought the present invention to completion.

Additionally, the present inventors have revealed that a microwave output required to start plasma emission can be reduced by providing the microwave sealing member to a predetermined position of a substrate-holding portion of substrate fixing means which holds the substrate with a gap therebetween and a time from introduction of a microwave into the plasma processing chamber to plasma emission can be reduced, and they have brought the present invention to completion.

Further, the present inventors have discovered that a uniform thin film can be formed on a processing target by using a porous pipe having an aperture distribution in a lengthwise direction as a gas supply member which supplies a processing gas into the plasma processing chamber of a plasma processing device or by constituting the gas supply member to be sectionalized into a metal electric field distribution stabilizing area and a non-metal end gas induction area, and they have brought the present invention to completion.

That is, there is provided a microwave plasma processing device according to the present invention having: fixing means for fixing a substrate as a processing target on a central axis in a plasma processing chamber; exhausting means for depressurizing the inside and outside of the substrate; a metal processing gas supply member which is present in the substrate and forms a reentrant cylindrical resonating system along with the plasma processing chamber; and microwave introducing means for introducing a microwave into the plasma processing chamber to perform processing, wherein a microwave sealing member is provided at a substrate-holding portion of the fixing means, a distance (D) between the microwave sealing member and a surface of the fixing means positioned in the plasma processing chamber is 0 to 55 mm, and a distance (L) between the microwave sealing member and an end portion of the processing gas supply member satisfies the following relational expressions:

A. in case of $0 \leq D < 20$ $$L=(n\lambda/2+\lambda/8)-3+\alpha$$

B. in case of $20 \leq D \leq 35$ $$L=(n\lambda/2+\lambda/8)-(-0.060D^2+4.2D-57)+\alpha$$

C. in case of $35 < D \leq 55$ $$L=(n\lambda/2+\lambda/8)-(-0.030D^2+2.1D-21)+\alpha$$

where n is an integer, $\lambda$ is a wavelength of the microwave, and $\alpha$ is a fluctuation band in consideration of an influence and the like of the substrate on an electric field and is ±10 mm.

As described above, in the present invention, providing the microwave sealing member at a predetermined position below the holding member can prevent the microwave introduced into the plasma processing chamber from leaking outside the chamber.

Furthermore, the processing chamber can be formed as the excellent resonating system by specifying a distance between the processing gas supply member end portion and the microwave sealing member. As a result, since an electric field intensity in the plasma processing chamber formed by the microwave can be improved and the electric field intensity distribution can be stabilized, the processing gas can be evenly processed into plasma. That is, the energy of the introduced microwave can be efficiently utilized, and a uniform thin film can be formed on the substrate of the processing target.

Moreover, there is provided a microwave plasma processing device according to the present invention having: fixing means for fixing a substrate as a processing target on a central axis in a plasma processing chamber; exhausting means for depressurizing the inside and outside of the substrate; a metal processing gas supply member which is present in the substrate and forms a reentrant cylindrical resonating system along with the plasma processing chamber; and microwave introducing means for introducing a microwave into the plasma processing chamber to perform processing, wherein a microwave sealing member is provided at a substrate-holding portion of the fixing means, and a connection position of the microwave introducing means is a position where an electric field is weak in an electric field intensity distribution formed in the plasma processing chamber.

As described above, in the present invention, since the electrical consistency between the processing chamber and the microwave can be improved by connecting the connection position of the microwave introducing means at a height of the weak-field position out of the field intensity distribution formed in the plasma processing chamber by introduction of the microwave, the electric field intensity distribution in the processing chamber is stabilized and efficiently acts on the processing gas, and hence the plasma can be efficiently and evenly generated. That is, since the energy of the introduced microwave can be efficiently utilized and generation of the plasma can be stabilized and uniformed, a uniform thin film can be formed on the substrate of the processing target.

In this case, it is preferable that a distance (D) between the microwave sealing member and a surface of the fixing means positioned in the plasma processing chamber is 0 to 55 mm, and a distance (H) between the microwave sealing member and the connection position of the microwave introducing means satisfies a relationship of the following expression:

$$H=L-(n_2\lambda/2+\lambda/8-3)+\beta \text{ (mm)}$$

[where $n_2$ is an integer satisfying $n_2 \leq n_1-1$, $\lambda$ is a wavelength of the microwave, $\beta$ is a fluctuation band caused due to a dimension or the like of the substrate and is ±10 mm, and L is a distance between the microwave sealing member and the end portion of the processing gas supply member and satisfies the following relationships:

A. in case of $0 \leq D < 20$ $$L=(n_1\lambda/2+\lambda/8)-3+\alpha$$

B. in case of $20 \leq D \leq 35$ $$L=(n_1\lambda/2+\lambda/8)-(-0.060D^2+4.2D-57)+\alpha$$

C. in case of $35 < D \leq 55$ $$L=(n_1\lambda/2+\lambda/8)-(-0.030D^2+2.1D-21)+\alpha$$

where $n_1$ is an integer which is not smaller than 1, $\lambda$ is a wavelength of the microwave, and $\alpha$ is a fluctuation band in consideration of an influence and the like of the substrate on an electric field and is ±10 mm].

As described above, in the present invention, the excellent resonating system can be formed in the processing chamber by providing the microwave sealing member at a predetermined position and specifying a distance between the microwave sealing member and the processing gas supply member end portion. The height (H) obtained above the above expression represents the field-weak position in the field intensity distribution formed in the processing chamber when the distance (L) satisfies the above expression. Connecting the microwave introducing means at this height (H) can improve the electric field intensity in the processing chamber as a whole.

It is to be noted that the above expression is an expression obtained as a result of an experiment and a result of an analysis using a computer program.

Additionally, there is provided a microwave plasma processing device according to the present invention having: fixing means for fixing a substrate as a processing target on a central axis in a plasma processing chamber; exhausting means for depressurizing the inside and outside of the substrate; a metal processing gas supply member which is present in the substrate and forms a reentrant cylindrical resonating system along with the plasma processing chamber; and microwave introducing means for introducing a microwave into the plasma processing chamber to perform processing, wherein a plasma ignition gap is formed on an end surface side of the substrate-holding portion of the fixing means and the microwave sealing member is provided in the formed gap.

As described above, in the present invention, since providing the plasma ignition gap between the microwave sealing member and the end surface of the holding member can reduce the microwave output required for ignition of the plasma, the plasma can be generated in a short time after starting introduction of the microwave.

In this case, it is preferable that driving means for relatively moving the microwave sealing member and the substrate-holding portion to the plasma processing device forming the microwave reentrant cylindrical resonating system, and the microwave sealing member and the substrate-holding portion are relatively moved by this driving means to adjust the plasma ignition gap between the microwave sealing member and the end surface of the substrate-holding portion.

As described above, in the present invention, a plasma emission start time can be adjusted by relatively moving the microwave sealing member and the substrate-holding portion and carrying out provision/elimination of the plasma ignition gap at an arbitrary timing.

Further, there is provided a plasma processing gas supply member according to the present invention which is a chemical plasma processing gas supply member comprising a porous pipe having an aperture distribution in a lengthwise direction.

In this case, it is preferable that a reference area having a fixed aperture and a blowing quantity adjustment area having an aperture smaller than that of the reference area are formed in a lengthwise direction in the porous pipe.

Furthermore, it is possible to adopt a configuration in which the blowing quantity adjustment area is formed at an end portion.

As described above, in the present invention, when performing chemical plasma processing, as a gas supply member (a gas supply pipe) which supplies a reactive gas into a predetermined processing area where a substrate to be processed is arranged, the porous pipe having an aperture distribution in the lengthwise direction is used. That is, a distribution is provided to the aperture of a hole of the porous pipe in a lengthwise direction of the pipe, the gas blowing quantity adjustment area having a smaller aperture (or a larger aperture) than that of the reference area is formed in addition to the reference area having, e.g., a predetermined aperture, and the porous pipe having the gas blowing quantity adjustment area formed at an appropriate position can be thereby used as the gas supply member in accordance with a plasma processing device to be utilized, thereby performing the chemical plasma processing.

For example, when a microwave is introduced into the plasma processing chamber of the plasma processing device and a source gas is supplied from the gas supply pipe arranged in the plasma processing chamber to perform the chemical plasma processing, the plasma processing device has an electric field intensity distribution inherent thereto, a thick film is formed at a part where the electric field intensity is high, and a thickness of a film formed at a part where the electric field intensity is low is small.

As described above, in the present invention, by inserting the porous pipe (the gas supply pipe) into the plasma processing chamber in such a manner that its gas blowing quantity adjustment area is placed at a part where the electric field intensity is large or small, occurrence of irregularities in thickness mentioned above can be suppressed, and a processed film having an even thickness can be formed.

It is to be noted that the porous pipe can be formed of an arbitrary porous material, and it is possible to provide the porous pipe according to the present invention by forming a hole with a predetermined distribution to, e.g., a non-porous metal pipe.

Moreover, there is provided a plasma processing gas supply member according to the present invention comprising a gas supply pipe which is inserted into a container held in a plasma processing chamber into which a microwave is introduced and supplies a reactive gas which is sued to form a CVD film on an inner surface of the container, wherein the gas supply pipe is sectionalized into two areas, i.e., an electric field intensity distribution stabilizing area and an end gas induction area which is positioned on an end side with respect to the electric field intensity distribution stabilizing area, at least a metal portion which communicates with a shield wall constituting the plasma processing chamber and extends from a root portion to a boundary between the electric field intensity distribution stabilizing area and the end gas induction area in an axial direction is formed in the electric field intensity distribution stabilizing area, and the end gas induction area is formed of a non-metal material.

In this case, the gas supply pipe comprises the porous metal pipe and the non-metal tubular end portion joined to the end thereof, the porous metal pipe can form the electric field intensity stabilizing area, and the non-metal tubular end portion can form the end gas induction area.

Additionally, the entire gas supply pipe is a non-metal porous pipe, a metal rod communicating with a shield wall constituting the plasma processing chamber and extending from a root portion in an axial direction extends inside the non-metal porous pipe, and the gas supply pipe is sectionalized into two areas, i.e., the electric field intensity distribution stabilizing area and the end gas induction area by this metal rod.

As described above, in the present invention, when performing the chemical plasma processing using microwaves, as the gas supply member which supplies the reactive gas (the plasma processing gas) into a container held in the plasma processing chamber, there is used the gas supply pipe which is sectionalized in two areas, i.e., the electric field intensity distribution stabilizing area and the end gas induction area positioned on the end side of the electric field intensity distribution stabilizing area. According to such a gas supply member, in the electric field intensity distribution stabilizing area, at least the metal portion communicating with the shield wall constituting the plasma processing chamber is formed along the entire axial direction of this area. This metal portion is constituted to extend from a root portion of the gas supply pipe to a boundary with the end gas induction area, and the gas supply pipe in this area comprises the metal porous pipe in the simplest form. When a length of the electric field intensity distribution stabilizing area in which such a metal portion is formed is set to have a fixed relationship with respect to a half-wavelength ($\lambda/2$) of the microwave used for the plasma processing, the plasma processing area (the inside of the container) can be formed as the excellent resonating system, the electric field intensity of the plasma processing area can be increased and, at the same time, the electric field intensity distribution along the axial direction of the container to be processed can be stabilized. Therefore, the reactive gas (the plasma processing gas) supplied from the gas supply pipe into the container can be efficiently and uniformly formed as plasma by forming the above-described area, which is advantageous to formation of a film having an even thickness.

The electric field intensity distribution area provides the above-described advantages when its length is set to satisfy a fixed relationship with respect to a half-wavelength (λ/2) of the microwave. Therefore, when the gas supply pipe is formed of the electric field intensity distribution stabilizing area only, since a length of the gas supply pipe cannot be arbitrarily adjusted, a position of the end portion is unavoidably apart from a bottom portion of the container, supply of the gas to the bottom portion of the container becomes insufficient, and hence a vapor deposition film (a CVD film) having a sufficient film thickness is hard to be formed. Thus, in the present invention, by forming the end gas induction area in which a pipe wall is constituted of a non-metal material on the end side of this electric field intensity distribution stabilizing area, a sufficient quantity of gas can be supplied to the bottom portion of the container without affecting the electric field intensity distribution. As a result, a CVD film having an even thickness can be formed on the container inner surface including the bottom portion.

Further, there is also a notable effect that using such a gas supply member according to the present invention enables formation of a CVD film having an even thickness to a container in which a planar cross-sectional shape of a trunk portion is an axisymmetrical shape like a circular shape as well as a container in which a cross-sectional shape of a trunk portion is a non-axisymmetrical shape like a rectangular shape.

Although the gas supply member (the gas supply pipe) is usually inserted along a center of the axis of the container, since a gap between the inner surface of the container trunk portion wall and the gas supply member is not even in the container in which a cross-sectional shape of the trunk portion is non-axisymmetrical, there is a problem that a thickness of a CVD film to be formed varies depending on a circumferential position of the trunk portion wall inner surface. That is because the trunk portion inner wall has a part where a gap with respect to the gas supply pipe is small and a part where the same is large, and there is a tendency that the CVD film has a large thickness at the part where the gap is small and the CVD film has a small thickness at the part where the gap is large. Thus, in the present invention, using the gas supply pipe in which the predetermined end gas induction area is formed at an end of the electric field intensity distribution stabilizing area can effectively suppress irregularities in thickness along the circumferential direction in such a non-axisymmetrical container.

In the present invention, the fact that irregularities in thickness along the circumferential direction in the non-axisymmetrical container can effectively suppressed has been experimentally confirmed, and the present inventors assumes that its reason is as follows. That is, an end position of the gas supply member is conventionally restricted by a function of a half-wavelength of the microwave in order to stabilize the electric field intensity, and a large gap is formed between this end position and the bottom portion of the container. In the present invention, in order to form the predetermined end gas induction area at the end portion of the gas supply member (the gas supply pipe), the gap between the gas supply pipe and the container bottom portion is narrowed by an amount corresponding to this area. It can be considered that the reactive gas sprayed on the surface of the bottom portion flows in the circumferential direction as a result of narrowing the gap, the gas which has moved in the circumferential direction flows into the part where the gap between the gas supply pipe and the trunk portion wall is large in particular and irregularities in thickness in the non-axisymmetrical container in the circumferential direction can be thereby effectively suppressed.

As described above, according to the gas supply member of the present invention, the vapor deposition film having a sufficient thickness can be likewise formed at the container bottom portion by the plasma CVD method using a microwave, and the vapor deposition film having an even thickness can be formed on the entire inner surface even in a container in which a planar shape of a trunk portion is either axisymmetrical or non-axisymmetrical.

DETAILED DESCRIPTION OF THE PREFERRED EMBODIMENTS

Preferred embodiments of a microwave plasma processing device and a plasma processing gas supply member according to the present invention will now be described hereinafter. It is to be noted that the present invention is not restricted to these embodiments.

[First Embodiment]

First, a microwave plasma processing device according to a first embodiment of the present invention will be described with reference to FIGS. 1 and 2.

This embodiment is an embodiment in which the microwave plasma processing device according to the present invention is applied to bottle inner surface processing. As a bottle in this embodiment, there is a biaxial-drawing-blow-molded bottle formed of polyester such as polyethylene terephthalate.

[Microwave Plasma Processing Device]

Figure 1:
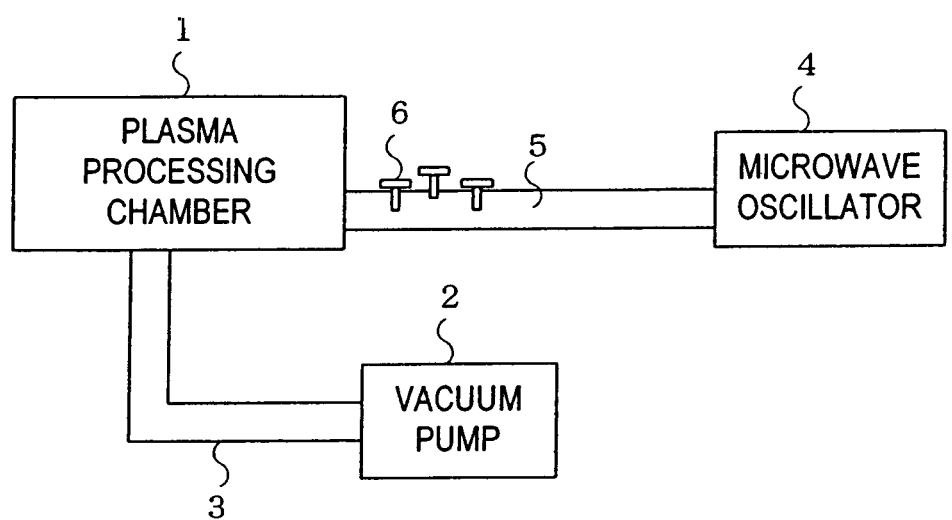
FIG. 1 is a schematic arrangement plan of a microwave plasma processing device according to a first embodiment of the present invention.

FIG. 1 is a schematic arrangement plan of the microwave plasma processing device according to this embodiment.

A vacuum pump 2 which performs emission of a gas in a processing chamber 1 and maintains the inside of this chamber in a depressurized state is connected with the plasma processing chamber 1 through an exhaust pipe 3. Further, a microwave oscillator 4 is connected through a waveguide tube 5 which is microwave introducing means.

The microwave oscillator 4 is not restricted in particular as long as it can oscillate a microwave which acts on a processing gas to produce glow discharge, and a commercially available one can be used.

The waveguide tube 5 is the microwave introducing means which efficiently transmits a microwave oscillated from the microwave oscillator 4 into the processing chamber 1, and one suitable for a wavelength of the microwave to be used can be utilized. As the microwave introducing means, a coaxial cable can be used in place of the waveguide tube.

It is to be noted that the three stub tuner 6 may be provided in order to adjust a microwave reflection quantity from the processing chamber at the minimum level. However, the tuner 6 just forcibly reduces a reflection quantity as much as possible, and cannot form an excellent resonating system inside the plasma processing chamber 1. That is, the excellent resonating system can be formed inside the plasma processing chamber 1 only by using the plasma processing device according to the present invention which will be described below, and efficient processing is possible without using adjusting means such as a tuner in this case.

[Plasma Processing Chamber]

Figure 2:
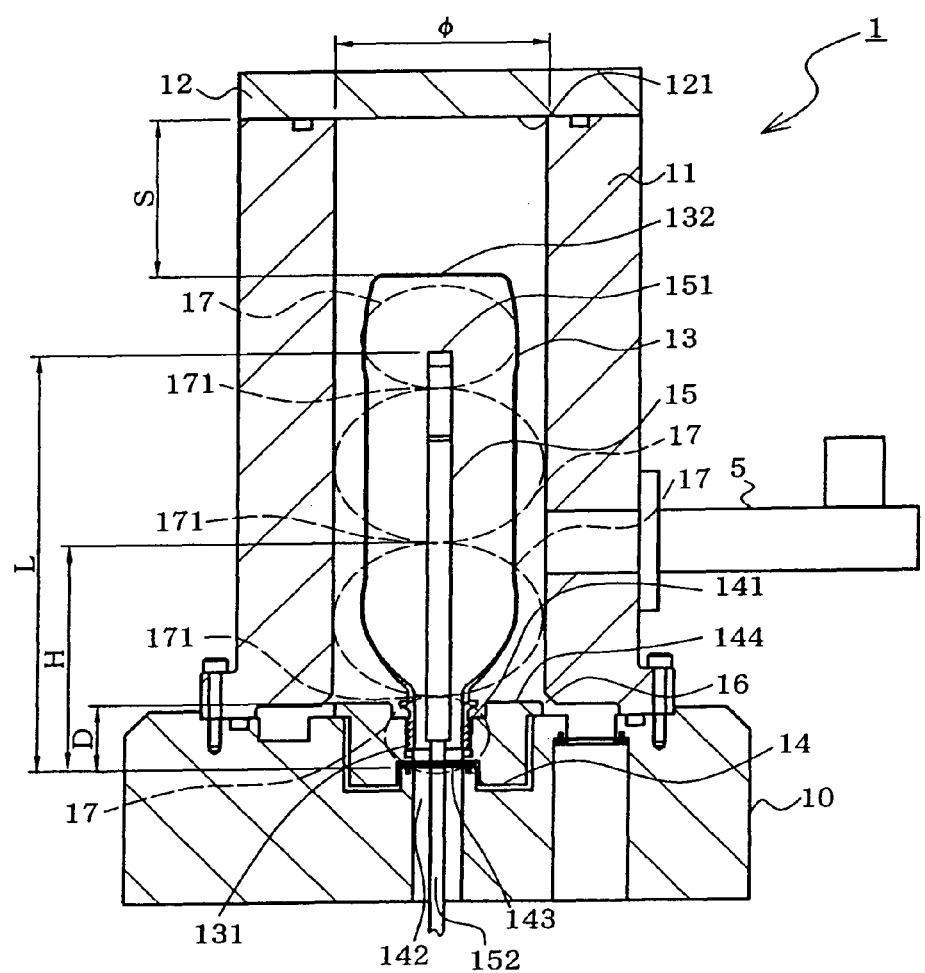
FIG. 2 is a schematic cross-sectional view of a plasma processing chamber of the microwave plasma processing device according to the first embodiment of the present invention.

FIG. 2 is a schematic cross-sectional view of the plasma processing chamber in the microwave plasma processing device according to this embodiment.

The plasma processing chamber 1 comprises a hollow chamber 11 mounted on a base 10, a detachable hood 12 positioned at an upper portion of the chamber 11, and bottle fixing means 14 which fixes a bottle 13 as a processing target. The waveguide tube 5 which transmits the oscillated microwave from the microwave oscillator 4 into the plasma processing chamber 1 is connected to a side surface of the chamber 11.

The plasma processing chamber 1 forms a so-called microwave reentrant cylindrical resonating system. That is, the cylindrical chamber 11 forms the plasma processing chamber 1, and an electroconductive processing gas supply member 15 is provided on an axis of this chamber in such a manner that an end portion of this member does not reach the hood 12.

The bottle 13 has a mouth portion 131 held by the bottle fixing means 14, and is fixed on the axis of the chamber 11. The processing gas supply member 15 is inserted into the bottle 13. In this state, the vacuum pump 2 forms a vacuum inside and outside the bottle 13, a processing gas is supplied from the processing gas supply member 15 inserted in the central part of the bottle 13, and a microwave is supplied from the side surface of the processing chamber 1.

The bottle fixing means 14 is positioned below the chamber 11, and has a bottle holding portion 141 which holds the mouth portion 131 of the bottle, an exhaust opening 142 which is used to depressurize the inside of the bottle 13 and a microwave sealing member 143 which is positioned directly below the bottle holding portion 141 and provided to cover the exhaust opening 142.

Furthermore, the bottle fixing means 14 is connected with a rod (not shown) capable of moving up and down. As a result, when the bottle 13 is attached to/detached from the bottle fixing means 14, the hood 12 is opened and the rod is moved up, thereby moving the bottle 13 (the fixing means 14) to the outside of the chamber 11.

The processing gas supply member 15 is inserted in such a manner that it pierces the bottle fixing means 14 coaxially with the chamber 11 and is positioned in the bottle 13.

The processing gas supply member 15 is connected with a processing gas supply device (not shown) through a processing gas supply path 152 so that the gas can be supplied at a predetermined speed.

As a material forming the processing gas supply member 15, it is possible to use a metal such as SUS, Al, Ti or the like. For example, in case of forming a chemical vapor deposition film on the inner surface of the bottle 13, using a porous metal is preferable since a resulting thin film layer can have the excellent homogeneity and the improved ductility and flexibility, and the productivity can be also improved.

Although one or more gas discharge holes are formed through the processing gas supply member 15, positions, a size and the number of the holes can be arbitrarily set.

It is preferable that the same type of film as the film formed on the inner surface of the bottle 13 by plasma processing is formed on the surface of the processing gas supply member 15.

A gap 16 is provided between the chamber 11 and the bottle fixing means 14 in order to depressurize the inside of the processing chamber 1, and connected with an exhaust pipe 3 through the base 10. Likewise, the exhaust opening 142 provided to the bottle fixing means 14 is also connected with the exhaust pipe 3 in order to depressurize the inside of the bottle 13.

The microwave sealing member 143 is provided in order to prevent the microwave from leaking outside the processing chamber 1 from the exhaust opening 142, and it is a member which has an effect of trapping in the processing chamber 1 the microwave introduced into this chamber. As this microwave sealing member 143, it is possible to use one which can transmit a gas therethrough without obstructing a depressurization step in the bottle 13 and can cut off the microwave, e.g., a wire gauze formed of SUS, Al, Ti or the like.

Moreover, in this embodiment, it is preferable to set a distance (D) from an upper surface 144 of the bottle fixing means 14 to the microwave sealing member 143 to 0 mm to 55 mm, and more preferably, 20 mm to 50 mm. When the distance (D) exceeds 55 mm, since the plasma processing chamber does not form a resonating system, an electric field intensity in the plasma processing chamber is reduced, and generation of plasma is difficult.

It is to be noted that, in a conventional microwave processing device described in PCT National Publication No. 2001-518685, the microwave cannot be satisfactorily trapped even if the microwave is introduced into the processing chamber 1 since the microwave partially leaks outside the chamber from a connection portion with the exhaust opening or the like, and the processing chamber 1 is incomplete as a resonating system. Therefore, an electric field intensity distribution formed in the processing chamber 1 by the introduced microwave is unstable, generation of plasma is consequently unstable and uneven, resulting in the state with the deteriorated energy efficiency.

In this embodiment, setting the microwave sealing member 143 at a predetermined position can prevent the microwave introduced into the processing chamber 1 from leaking outside the chamber, thereby improving the utilization efficiency of the energy of the introduced microwave.

That is, the microwave sealing member 143 is determined as a reference, and a distance from this member to each constituent member is specified, thereby facilitating optimization in the processing chamber 1.

First, in this embodiment, a distance (L) from the microwave sealing member 143 to a gas supply member end portion 151 is set to satisfy the following relationships.

A. In case of $0 \leq D < 20$ $$L=(n\lambda/2+\lambda/8)-3+\alpha$$

B. In case of $20 \leq D \leq 35$ $$L=(n\lambda/2+\lambda/8)-(-0.060D^2+4.2D-57)+\alpha$$

C. In case of $35 < D \leq 35$ $$L=(n\lambda/2+\lambda/8)-(-0.030D^2+2.1D-21)+\alpha$$

where n is an integer, $\lambda$ is a wavelength of the microwave, and $\alpha$ is ±10 mm which is a fluctuation band in consideration of an influence and the like of the substrate on an electric field.

Additionally, in this embodiment, it is preferable for a distance (H) between the microwave sealing member 143 and a connection position of the microwave introducing means to satisfy a relationship of the following expression.

$$H=L-(n_2\lambda/2+\lambda/8-3)+\beta \text{ (mm)}$$

where $n_2$ is an integer satisfying $n_2 \leq n_1-1$, $\lambda$ is a wavelength of the microwave, $\beta$ is +10 mm which is a fluctuation band caused due to a dimension or the like of the substrate, and L is a distance between the microwave sealing member and the processing gas supply member end portion and satisfies the following relationship.

A. In case of $0 \leq D < 20$ $$L=(n_1\lambda/2+\lambda/8)-3+\alpha$$

B. In case of $20 \leq D \leq 35$ $$L=(n_1\lambda/2+\lambda/8)-(0.060D^2+4.2D-57)+\alpha$$

C. In case of $35 < D \leq 55$ $$L=(n_1\lambda/2+\lambda/8)-(0.030D^2+2.1D-21)+\alpha$$

where $n_1$ is an integer not less than 1, $\lambda$ is a wavelength of the microwave, and $\alpha$ is ±10 mm which is a fluctuation band in consideration of an influence and the like of the substrate on an electric field.

Each of the above expressions is an expression obtained as a result of an experiment and a result of analysis using a computer program.

H obtained from this expression indicates a part corresponding to a node 171 of an electric field intensity distribution 17 formed on the processing gas supply member 15 by introducing the microwave, i.e., a part having the low electric field intensity (see FIG. 2). Connecting the waveguide tube 5 at the same height as this part can minimize a reflected wave which flows backward through the waveguide tube 5 without being consumed in the processing chamber 1. That is, the introduced microwave can be efficiently utilized for formation of plasma from the processing gas.

Further, when the distance (L) satisfies the above-described relational expressions, the electric field intensity formed in the processing chamber 1 by the introduced microwave can be entirely improved, and an electric field intensity distribution can be stabilized. Therefore, the energy of the introduced microwave can be efficiently used for generation of the plasma, and the state of the plasma is stable and uniform, thereby evenly processing the surface of the bottle inner surface.

When a microwave having a frequency of, e.g., 2.45 GHz is used, a wavelength of this microwave is approximately 120 mm. Assuming that the distance (D) from the upper surface 144 of the bottle fixing means 14 to the microwave sealing member 143 is 30 mm, a value of the distance (L) which satisfies the above-described expression and with which the stable plasma can be obtained is 60±10 mm, 120±10 mm, 180±10 mm or the like. Furthermore, it is preferable to select a length with which the end portion 151 of the processing gas supply member can be placed at a position close to the bottle bottom portion 132 as much as possible from these values of L in accordance with a shape, a size and others of the bottle 13 as a processing target since a vapor deposition film having an even thickness can be formed on the entire surface of the bottle 13.

Moreover, the distance (H) between the microwave sealing member 143 and the connection position of the microwave introducing means (the waveguide tube 5) at this moment is 48 mm, 108 mm, 168 mm or the like.

It is preferable to select a length with which the end portion 151 of the processing gas supply member can be placed at a position close to the bottle bottom portion 132 as much as possible from these values of H and L in accordance with a shape, a size and others of the bottle 13 as a processing target since a vapor deposition film having an even thickness can be formed on the entire surface of the bottle 13.

For example, as the distance (L), 170 to 190 mm is preferable for the processing of a general bottle container whose capacity is 500 ml, and 110 to 130 mm is preferable for the processing of a bottle container whose capacity is 350 ml.

It is to be noted that although the number of the connection position of the waveguide tube 5 is one in this embodiment, the waveguide tube 5 may be connected at a plurality of positions H satisfying the above-described expression.

Additionally, it is preferable for a distance (S) from the bottle bottom portion 132 to a hood lower surface 121 to fall within a range of 5 mm to 150 mm. Since setting this distance within this range can improve the consistency of the chamber 11 and the microwave, the electric field intensity distribution in the processing chamber 1 can be further stabilized. In particular, a range of 30 mm to 100 mm is preferable.

Further, it is preferable for an internal diameter (φ) of the processing chamber 1 to fall within a range of 40 mm to 150 mm. By setting the internal diameter of the processing chamber 1 within this range, electric field concentration effect toward the center of the processing chamber 1 can be demonstrated, which is more effective. In particular, a range of 65 mm to 120 mm is preferable.

[Microwave Plasma Processing Method]

A bottle processing method using the above-described microwave plasma processing device according to this embodiment will now be concretely described.

First, the bottle 13 is fixed to the bottle fixing means 14. At this moment, the hood 12 has been already removed from the chamber 11, and the bottle fixing means 14 has moved up in the chamber 11 by the rod (not shown) to be placed at the upper portion of the chamber 11.

In this state, the mouth portion of the bottle 13 is held by the bottle holding portion 141, the rod is moved down to arrange the mouth portion at a predetermined position of the bottle fixing means 14. Then, the hood 12 is closed to seal the inside of the chamber 11, thereby entering the state shown in FIG. 2.

Subsequently, the vacuum pump 2 is driven to provide the depressurized state in the bottle 13. At this time, in order to avoid deformation of the bottle 13 by an external pressure, it is also possible to provide the depressurized state in the plasma processing chamber 1 outside the bottle by the vacuum pump 2.

It is good enough to perform depressurization in the bottle 13 to the extent that glow discharge is produced when the processing gas is introduced and the microwave is introduced. Specifically, performing depressurization within a range of 1 to 500 Pa, especially 5 to 200 Pa is preferable for an improvement in the efficiency of the plasma processing.

On the other hand, depressurization in the plasma processing chamber 1 outside the bottle 13 is carried out to the extent that glow discharge is not generated even when the microwave is introduced, e.g., 1000 to 10000 Pa.

After reaching this depressurized state, the processing gas is supplied into the bottle 13 by the processing gas supply member 15.

Although a processing gas supply quantity varies depending on a superficial area of the bottle 13 as a processing target or a type of the processing gas, it is preferable to supply the processing gas with, e.g., a flow quantity of 1 to 500 cc/min, especially 2 to 200 cc/min in a standard state per container.

When forming a thin film by the reaction of a plurality of processing gases, one processing gas can be excessively supplied. For example, it is preferable to excessively supply an oxygen gas as compared with a silicon source gas in case of forming a silicon oxide film, and nitrogen or ammonia can be excessively supplied as compared with a metal source gas in case of forming a nitride film.

Subsequently, a microwave is introduced into the plasma processing chamber 1 through the waveguide tube 5. As the microwave, the microwave is not restricted in particular as long as it can act on the processing gas to generate glow discharge, but it is preferable to use a microwave having 2.45 GHz, 5.8 GHz or 22.125 GHz as a frequency which is allowed for an industrial use.

Although an output of the microwave differs depending on a superficial content of the bottle 13 or a type of the processing gas, it is preferable to introduce the microwave in such a manner that 50 to 1500 W, especially 100 to 1000 W can be achieved per bottle, for example.

The microwave introduced into the processing chamber 1 provides the processing gas with the high-energy state, and forms a plasma state. The processing gas formed as the plasma acts on and is deposited on the inner surface of the bottle 13, thereby forming a coating film.

Although a processing time in this example varies depending on a superficial content of the bottle 13, a thickness of a thin film to be formed, a type of the processing gas and others and hence it cannot be generally specified, a time of one second or more is required per bottle in order to stabilize the plasma processing, for example. A shorter processing time is preferable in terms of the cost.

After performing the plasma processing, supply of the processing gas and introduction of the microwave are stopped, and air is gradually introduced through the exhaust pipe 3 so that the inside and outside of the bottle 13 return to an ordinary pressure. Thereafter, the hood 12 is removed, the bottle fixing means 14 is moved up, and the bottle subjected to the plasma processing is removed outside the plasma processing chamber 1.

[Bottle Container as Processing Target]

In this embodiment, as the bottle which can be processed, there is a bottle containing plastic as a raw material.

As plastic, there are a known thermoplastic resin, e.g., low-density polyethylene, high-density polyethylene, polypropylene, polyolefin such as polyl-butene or poly4-methyl-1-pentene; a random copolymer or a block copolymer consisting of □-olefin such as ethylene, propylene, a-butene or 4-methyl-1-pentene; an ethylene vinyl compound copolymer such as an ethylene vinyl acetate copolymer, an ethylene vinyl alcohol copolymer or an ethylene chloroethene copolymer; a styrene-based resin such as polystyrene, a acrylic nitrile styrene copolymer, ABS or a □-methylstyrene styrene copolymer; a polyvinyl compound such as polyvinylchloride, polyvinylidene chloride, a chloroethene vinylidene chloride copolymer, polyacrylic methyl or polymethacrylic methyl; polyamide such as nylon 6, nylon 6-6, nylon 6-10, nylon 11 or nylon 12; thermoplastic polyester such as polyethylene terephthalate, polybutylene terephthalate or polyethylene naphthalat; polycarbonate, polyphenylene oxide, polylactic acid and others. Each of these resin may be solely used, or two or more types of these resins may be mixed or multi-layered to be used. Further, it is possible to use a multi-layer plastic container in which an oxygen absorbing material or various kinds of moisture or oxygen barrier material are arranged as an intermediate layer.

Furthermore, it is possible to apply to various kinds of glass, ceramic or porcelain; oxide-based ceramic such as alumina, silica, titania or zirconia; nitride-based ceramic such as aluminium nitride, boron nitride, titanium nitride, silicon nitride or zirconium nitride; carbide-based ceramic such as silicon carbide, boron carbide, tangsten carbide or titanium carbide; boride-based ceramic such as silicon boride, titanium boride or zirconium boride; high-dielectric ceramic such as rutile, magnesium titanate, zinc titanate or rutile-lanthanum oxide; piezoelectric ceramic such as lead titanate; and various kinds of ferrite.

It is to be noted that the present invention is not restricted to the above-described embodiment, and it can be applied to processing of a substrate having a shape like a general container or a pipe such as a cup other than the bottle.

[Processing Gas]

As the processing gas, various kinds of gases can be used in accordance with purposes of the plasma processing.

For example, for the purpose of improving gas barrier properties of a plastic container, a compound containing atoms, molecules or ions constituting a thin film is set in a gas phase state to be used together with an appropriate carrier gas. As a compound which is a raw material of a thin film, it must have the high volatility.

As a concrete example, in order to form a carbon film or a carbide film, carbon hydrides such as methane, ethane, ethylene or acetylene are used.

In order to form a silicon film, silicon tetrachloride, silane, an organic silane compound, an organic siloxane compound or the like is used.

An oxygen gas is used for formation of an oxide film, and a nitrogen gas or an ammonia gas is used for formation of a nitride film.

Further, for the purpose of surface property modification of plastic, a bridge configuration can be introduced to the surface of plastic by using carbon dioxide, or the same characteristics as those of polytetrafluoroethylene, e.g., the non-adhesiveness, a low friction coefficient, the heat resistance or the chemical resistance can be provided to the plastic surface by using a fluorine gas.

Besides, it is possible to use a halogenide (a chloride) or an organic metal compound of, e.g., titanium, zirconium, tin, aluminum, yttrium, molybdenum, tungsten, gallium, tantalum, niobium, iron, nickel, chrome or boron.

Two or more types of these processing gases can be appropriately combined and used in accordance with a chemical composition of a thin film to be formed.

On the other hand, as the carrier gas, argon, neon, xenon, hydrogen or the like is appropriate.

As described above, according to the microwave plasma processing device of this embodiment, the microwave sealing member is provided at a predetermined position of the substrate-holding portion of the fixing means, a length of the processing gas supply member is specified with this position being determined as a reference, the connection position of the microwave introducing means is specified, and hence the processing gas can be evenly turned into plasma with the excellent energy efficiency, thereby forming an even thin film on the target substrate to be processed.

[Embodiment]

Excellent effects of the microwave plasma processing device according to this embodiment will now be described with reference to the following experimental examples. Incidentally, it is needless to say that the microwave plasma processing device according to the present invention is not restricted to the following examples.

Experimental Conditions

As a base material which is a processing target, a PET bottle having a mouth portion nominal diameter of φ28 mm was used.

An organic silicon compound gas ad an oxygen gas were used as the processing gas, and gas flow quantities were determined as 2 sccm and 20 sccm, respectively.

Degrees of vacuum inside and outside the bottle at the time of plasma processing were adjusted to be 20 Pa and 7000 Pa so that plasma can be excited only in the bottle when the microwave is supplied.

The microwave was oscillated by using a commercially available microwave power supply (2.45 GHz), and it was supplied into the plasma processing chamber with an output of 500 W. It is to be noted that a plasma processing time was determined as 10 seconds after plasma ignition.

EXPERIMENTAL EXAMPLE 1

In the microwave plasma processing device shown in FIG. 2, the plasma processing was conducted with respect to PET bottles having inner capacities of 500 ml (Experiments 1-1 to 1-3) and 350 ml (Experiment 1-4) by using a chamber 11 having a dimension with which a distance (S) between a bottom portion 132 of the bottle having an internal diameter of φ90 mm and an inner capacity of 500 ml and a hood lower surface 121 is 75 mm, bottle fixing means 14 and a processing gas supply member 15 with which a distance (D) from an upper surface 144 of the bottle fixing means 14 to a microwave sealing member 143 and a distance (L) from the microwave sealing member 143 to a gas supply member end portion 151 become values shown in Table 1.

As an evaluation, whether plasma emission is possible and a reflection intensity of the microwave which can be considered to be returned without being used for the plasma processing were checked.

Furthermore, in regard to conditions under which the processing was performed, oxygen barrier properties were checked by using Ox-tran manufactured by Mocon in order to judge the performance of a coating film formed by the processing.

Table 1 shows an evaluation result.

TABLE 1

| | D (mm) | L (mm) | Possibility/impossibility of plasma emission | Reflected wave intensity W | Barrier properties |
|---|---|---|---|---|---|
| Experiment 1-1 | 30 | 200 | X | — | — |
| | | 190 | Δ (Emission is weak) | 120 | X |
| | | 180 | ○ | 30 | ○ |
| | | 170 | Δ (Emission is weak) | 130 | X |
| | | 160 | X | — | — |
| | | 140 | X | — | — |
| | | 120 | ○ | 35 | Δ |
| | | 100 | X | — | — |
| Experiment 1-2 | 60 | 200 | X | — | — |
| | | 190 | X | — | — |
| | | 180 | X | — | — |
| | | 170 | X | — | — |
| | | 160 | X | — | — |
| Experiment 1-3 | 20 | 180 | Δ (Emission is weak) | 90 | Δ |
| | 30 | | ○ | 30 | ○ |
| | 40 | | ○ | 50 | ○ |
| | 50 | | Δ (Emission is weak) | 145 | Δ |
| Experiment 1-4 | 30 | 130 | Δ | 105 | Δ |
| | | 120 | ○ | 40 | ○ |
| | | 110 | Δ | 95 | Δ |

* Oxygen barrier properties (achievement of a target value)
○: satisfactory (within a practical range)
Δ: rather insufficient
X: definitely insufficient In Experiment 1-1, since D is 30 mm, L satisfying the expression $L=(n\lambda/2+\lambda/8)-(-0.060D^2+4.2D-57)$ is 60 mm±α, 120 mm±α, 180 mm±α or the like.

It was confirmed that plasma emission is generated and a thin film was able to be formed on the bottle when D and L satisfy this condition. That is, it was confirmed that the plasma processing with respect to the bottle is possible within a range of 180 mm±10 mm.

In this experimental example, the bottle container having the excellent barrier properties was obtained in an area where α is ±5 mm, in particular.

Based on Experiment 1-2, it was confirmed that plasma emission is not generated irrespective of a value of L when D becomes large.

It was confirmed from Experiment 1-3, it was confirmed that the plasma processing can be performed assuming that D=20 to 50 mm and L=175 to 185 mm. In particular, the result was good when a value of D is 25 to 45 mm. This value of L is suitable for the bottle having the capacity of 500 ml.

Further, it was confirmed from Experiment 1-4 that the plasma processing can be performed even when a value of L is set to 110 mm to 130 mm suitable for the bottle having the capacity of 350 ml. It was found that stable plasma emission with the good energy efficiency can be obtained and a bottle with the excellent properties can be acquired by the processing when a value of D is set to 115 to 125 mm in particular.

EXPERIMENTAL EXAMPLE 2

A bottle was set in the same device as that of Experimental Example 1, the dimension (D) was set to values shown in Table 2, and the dimension (L) with which the reflection intensity of the microwave becomes minimum with respect to each dimension (D) was checked by using a PET bottle having a capacity of 500 ml.

Furthermore, excellent combinations of the dimensions (D) and (L) were obtained by using commercially available spread sheet software based on this result.

Table 2 shows a result.

TABLE 2

| D (mm) | 20 | 25 | 30 | 35 | 40 | 45 | 50 |
|---|---|---|---|---|---|---|---|
| L (mm) | 192 | 185 | 180 | 179 | 180 | 182 | 186 |

[Second Embodiment]

A microwave plasma processing device according to a second embodiment of the present invention will now be described with reference to FIGS. 3 and 4.

Figure 3:
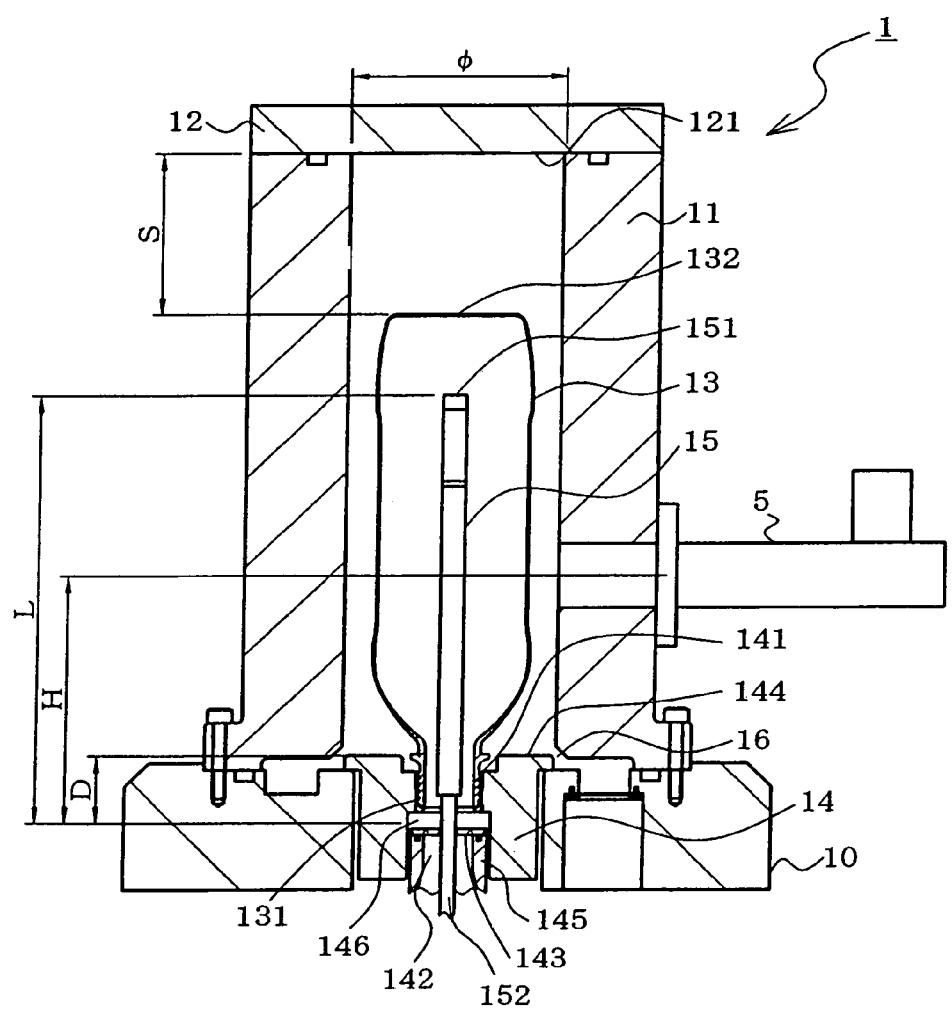
FIG. 3 is a schematic cross-sectional view of a plasma processing chamber of a microwave plasma processing device according to a second embodiment of the present invention.
Figure 4:
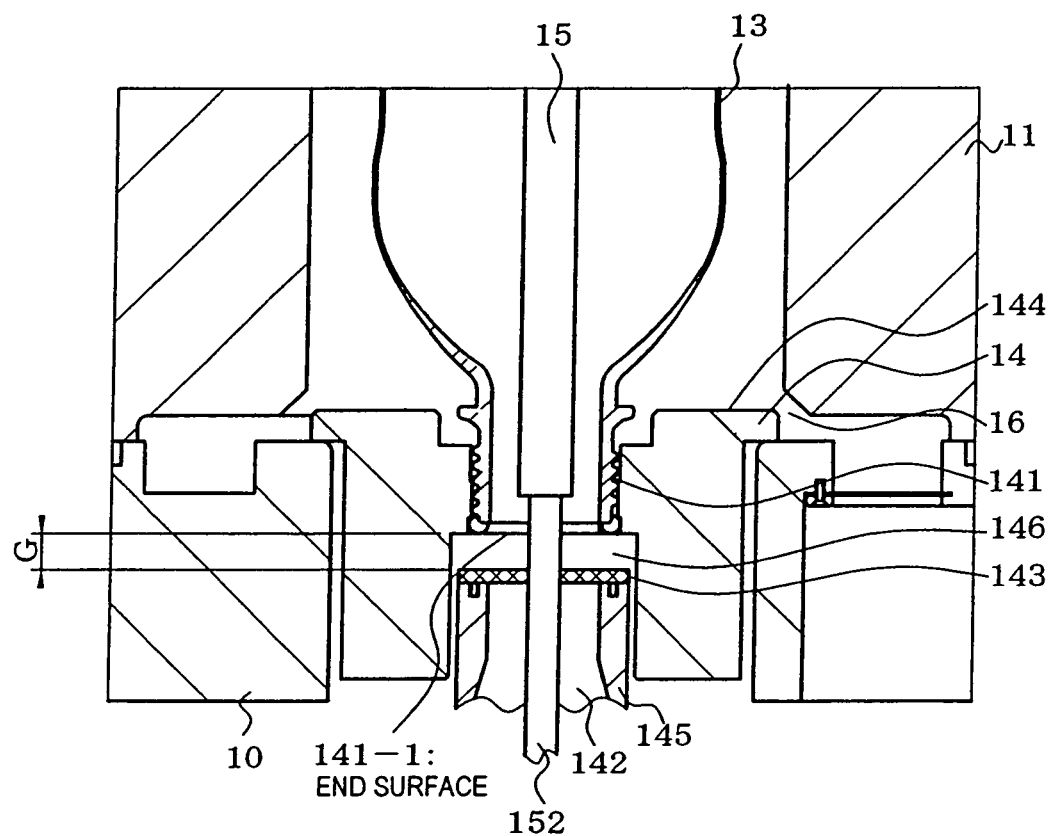
FIG. 4 is a partially enlarged cross-sectional view of bottle fixing means of the microwave plasma processing device according to the second embodiment of the present invention.

FIG. 3 is a schematic cross-sectional view of a plasma processing chamber in the microwave plasma processing device according to this embodiment, and FIG. 4 is a partially enlarged cross-sectional view of bottle fixing means.

As shown in these drawings, this embodiment has a configuration in which an arbitrary plasma ignition gap 146 is provided between the microwave sealing member 143 and the end surface 141-1 of the bottle holding portion of the microwave plasma processing device according to the first embodiment and a size of this gap can be adjusted.

Therefore, any other configurations, functions, effects and advantages are the same as those of the microwave plasma processing device described in conjunction with the first embodiment.

[Plasma Ignition Gap]

That is, in the microwave plasma processing device according to this embodiment, a sealing member fixing frame 145 is inserted in an axial direction at the lower portion of bottle fixing means 14 so that this frame can independently move in a longitudinal direction in the bottle fixing means 14. This sealing member fixing frame 145 is moved by using a non-illustrated cylinder or the like. By moving the sealing member fixing frame 145 in this manner, the arbitrary plasma ignition gap 146 is provided between the microwave sealing member 143 and the end surface 141-1 of the bottle holding portion and a size of this gap is adjusted.

It is to be noted that the plasma ignition gap 146 is adjusted by moving the sealing member fixing frame 145 in this embodiment, but the present invention is not restricted thereto, and the bottle fixing means 14 may be moved, or both the sealing member fixing frame 145 and the bottle fixing means 14 may be moved to adjust the plasma ignition gap 146.

[Effect of Plasma Ignition Gap]

The effect of the plasma ignition gap 146 in this embodiment will now be described.

Figure 5:
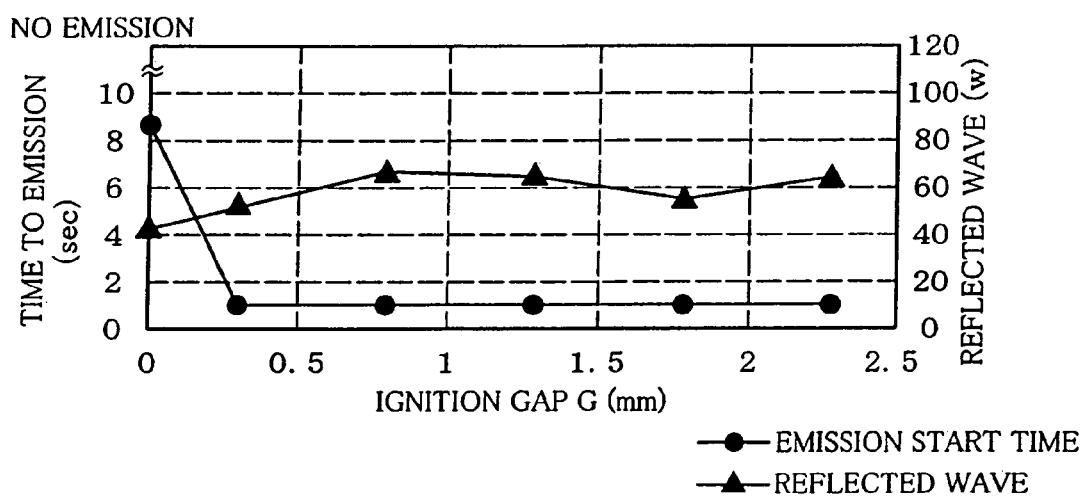
FIG. 5 is a graph showing a relationship between a size G of an ignition gap and a time from introduction of a microwave to plasma emission and a relationship between the size G of the gap and an intensity of the microwave (a reflected wave) which has returned from the plasma processed chamber without being effectively used for plasma during plasma emission in the microwave plasma processing device according to the second embodiment of the present invention.

FIG. 5 is a graph showing a relationship between a size G of the ignition gap 146 and a time from introduction of the microwave to plasma emission and a relationship between the size G of the gap 146 and an intensity of the microwave (a reflected wave) which has returned from the plasma processing chamber 1 without being effectively used in plasma emission in the microwave plasma processing device according to this embodiment.

In a state where the ignition gap 146 is not provided between the microwave sealing member 143 and the end surface 141-1 of the bottle holding portion 141, the reflected wave is small and the conditions are good in terms of the energy efficiency of the plasma, but approximately nine seconds were required from start of introduction of the microwave to plasma emission, and this time varied each time. On the contrary, when the ignition gap 146 was provided, approximately one second was required from start of introduction of the microwave to plasma emission, the time was greatly reduced and rarely varied each time.

Figure 6:
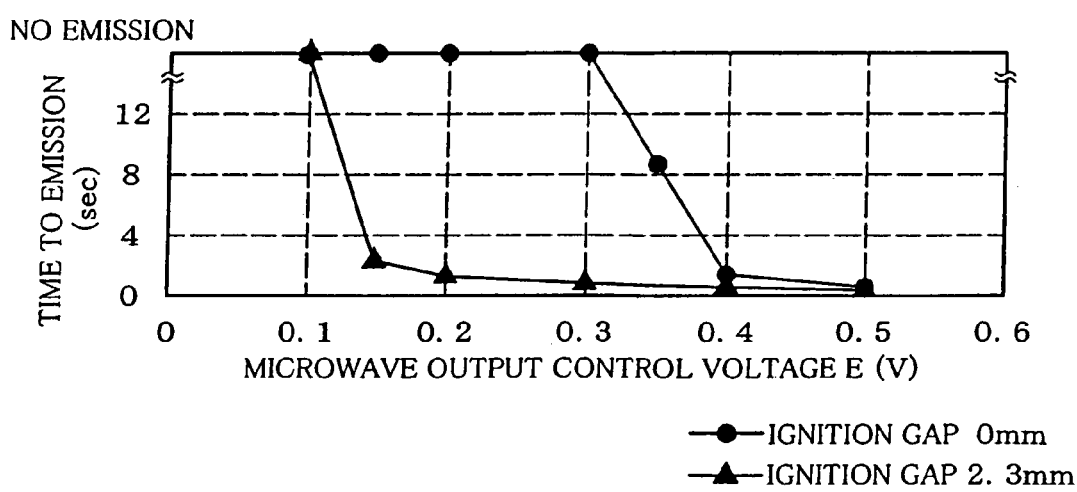
FIG. 6 is a graph showing a relationship between a control voltage E which is used to set an output of the microwave based on presence/absence of the ignition gap and a time from introduction of the microwave to plasma emission in the microwave plasma processing device according to the second embodiment of the present invention.

FIG. 6 is a graph showing a relationship between a control voltage E (V) which is used to set an output (W) of the microwave and a time from introduction of the microwave to plasma emission in accordance with presence/absence of the ignition gap 146 in the microwave plasma processing device according to this embodiment.

An output control voltage of the microwave which is not smaller than 0.4 V is required in order to generate plasma emission when the ignition gap 146 is not provided between the microwave sealing member 143 and the end surface 141-1 of the bottle holding portion 141, but plasma emission can be started even at 0.15 V when the ignition gap 146 is provided.

It is to be noted that measurement values shown in FIGS. 5 and 6 are measurement results obtained when a chamber diameter is φ90 mm, a length of the processing gas supply member is 180 mm, a degree of vacuum in the bottle is 20 Pa and a mixed gas of oxygen and hexamethyldisiloxane (HMDSO) was supplied as the processing gas in such a microwave plasma processing device as shown in FIG. 3 (and FIG. 4).

Moreover, it was assumed that an output control voltage of the microwave is 0.35 V in the measurement of a time to plasma emission shown in FIG. 5, and it is 1.6 V in the measurement of the reflected wave.

When the ignition gap 146 is provided in this manner, the microwave output required for plasma ignition can be greatly reduced, and the time from introduction of the microwave to plasma emission can be considerably shortened.

Although the reason why the emission lower limit output can be reduced by provision of the ignition gap 146 is not known exactly, it can be considered that the microwave introduced into the plasma processing chamber 1 concentrates in the ignition gap 146, an electric field intensity in this part is thereby locally increased, and hence this strong electric field acts on the processing gas to form the plasma.

In this embodiment, it is preferable for the ignition gap 146 between the microwave sealing member 143 and the end surface 141-1 of the bottle holding portion 141 to be 0.05 mm to 10 mm. When this gap is smaller than 0.05 mm, the definite ignition gap 146 cannot not assured depending on mechanical dimension accuracies, and the time from introduction of the microwave to start of plasma emission (an induction time) cannot be shortened in some cases. When this gap is larger than 10 mm, concentration of the microwave in the ignition gap 146 is hardly generated, and the microwave may possibly leak outside the processing chamber 1 in some cases. In particular, 0.2 to 5 mm is preferable.

[Microwave Plasma Processing Method]

A bottle processing method using the microwave plasma processing device according to this embodiment will now be described.

First, each of processing of fixing the bottle 13 to the bottle fixing means 14, depressurization processing of the bottle 13 and the plasma processing chamber 1 and processing of supplying the processing gas into the bottle 13, the same processing as that in the first embodiment is carried out under the same conditions.

Subsequently, the microwave is introduced into the plasma processing chamber 1 through the waveguide tube 5.

Figure 7:
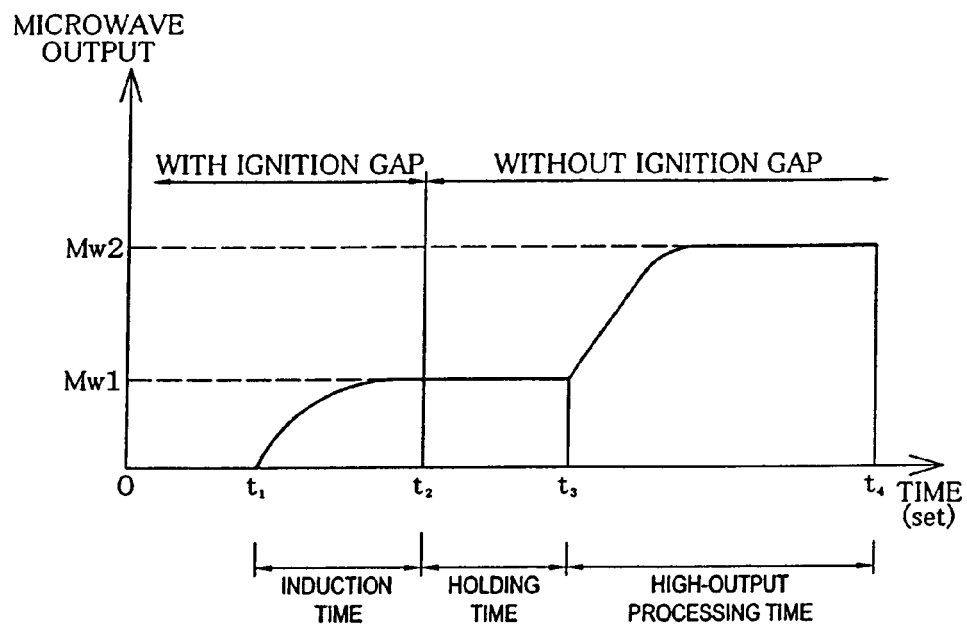
FIG. 7 is a view illustrating a control example of the microwave output and the ignition gap in a plasma processing method using the microwave plasma processing device according to the second embodiment of the present invention.

FIG. 7 is a view illustrating a control example of the microwave output and the ignition gap in the plasma processing method according to this embodiment.

First, in a state where the ignition gap 146 is provided, introduction of the microwave is started (t1). Introduction of the microwave in this example is carried out at a low output (Mw1).

Generally, an output of a set value is not oscillated immediately after start of introduction of the microwave, and a rising set output is slowly reached as shown in FIG. 7. In order to start plasma emission, the microwave which is not smaller than a fixed output must be introduced (see FIG. 6). When the microwave is introduced into the plasma processing chamber 1, plasma emission is generated after an induction time (t2).

In this embodiment, since the ignition gap 146 is provided at the time of plasma ignition, an output of the microwave required for plasma ignition can be lowered, and the induction time can be set to the stable minimum necessary time (see FIG. 6).

It can be considered that these reductions are possible because the introduced microwave concentrates around the ignition gap 146 between the microwave sealing member 143 and the bottle holding portion end surface 141-1, the energy density in this part is thereby increased, and hence the processing gas can efficiently have the high energy to form the plasma state.

After plasma emission, it is preferable to move up the sealing member fixing frame 145 in the longitudinal direction to eliminate the ignition gap 146 between the microwave sealing member 143 and the end surface 141-1 of the bottle holding portion. When the ignition gap 146 is not provided, since a quantity of the reflected wave is minimum (see FIG. 5), the utilization efficiency of the microwave is high, and an electric field intensity distribution formed in the microwave processing chamber 1 is also optimized. Therefore, a film formed on the inner surface of the bottle 13 becomes homogenous.

It is to be noted that an output of the microwave is maintained in a low-output state during a predetermined time (a holding time) even after plasma ignition. A layer aboundingly containing organic components can be formed on the bottle 13 by performing the plasma processing in the low-output state.

For example, when an organic silicon compound is used as the processing gas, it is considered that a silicon oxide film is formed through the next reaction paths.

(a) Extraction of hydrogen: $SiCH_3 \rightarrow SiCH_2$.
(b) Oxidization: $SiCH_2 \rightarrow SiOH$
(c) Condensation: $SiOH \rightarrow SiO$ Since the microwave with a relatively high output must be introduced for plasma emission in the prior art, a state of plasma is a high-output state from start of plasma emission. Therefore, the reaction is made all at once to the stage of the above-described reaction formula (c), a silicon oxide film layer having the poor flexibility is thereby directly formed on the surface of the bottle 13, and the adhesiveness between the bottle 13 and the silicon oxide film layer is low.

On the contrary, in the present embodiment, since the plasma can be ignited by using the low-output microwave, and the plasma emission can be thereafter maintained with the excellent energy efficiency at a low output, the $SiCH_2$. radials generated at the stage of the reaction formula (a) react with each other, and a thin film consisting of an organic silicon compound polymer is formed on the bottle 13.

Since this thin film has the flexibility and demonstrates the excellent effect as a binder of the bottle 13 and a silicon oxide film formed at a subsequent step, thereby forming a thin film layer with the good adhesiveness on the bottle 13.

Although the output (Mw1) of the microwave in a low-output state varies depending on a superficial content of the bottle 13 or a type of the processing gas, it is preferable to introduce the microwave so that 30 to 100 W is provided per bottle, for example. Further, a holding time of 0.1 second to 5 seconds is preferable.

After elapse of the holding time, the microwave with a high output is introduced (Mw2), and processing based on the plasma in a high-output state is carried out. As a result, in case of, e.g., an organic silicon compound, a hard silicon oxide film having the excellent gas barrier properties obtained by the reaction formula (c) is formed.

Although an output (Mw2) of the microwave in a high-output state varies depending on a superficial content of the bottle 13 or a type of the processing gas, it is preferable to introduce the microwave in such a manner 100 W to 1000 W is provided per bottle, for example.

Although a processing time of, e.g., 1 second or more is required per bottle in order to assure the stability of the plasma processing, a shorter time is preferable in terms of a cost.

It is to be noted that the microwave to be introduced is not restricted in particular as long as it acts on the processing gas to generate glow discharge like the first embodiment, but it is preferable to use the microwave having a frequency of 2.45 GHz, 5.8 GHz or 22.125 GHz which is allowed for an industrial use.

After performing the plasma processing, supply of the processing gas and introduction of the microwave are stopped, and air is gradually introduced through the exhaust pipe 3 so that the inside and outside of the bottle are returned to an ordinary pressure. Thereafter, the hood 12 is removed, the bottle fixing means 14 is moved up, and the bottle subjected to the plasma processing is removed to the outside of the plasma processing chamber 1.

[Another Control Example concerning Microwave Plasma Processing Method]

Another control example in the microwave plasma processing device according to this embodiment including the ignition gap 146 will now be described.

In the foregoing embodiment, the ignition gap 146 is previously provided before introducing the microwave into the processing chamber 1, and ignition of the plasma is carried out with introduction of the microwave being determined as a starting point (a trigger). However, the present invention is not restricted thereto, an ignition timing of the plasma can be controlled by controlling the ignition gap 146 as will be described later, for example.

Figure 8:
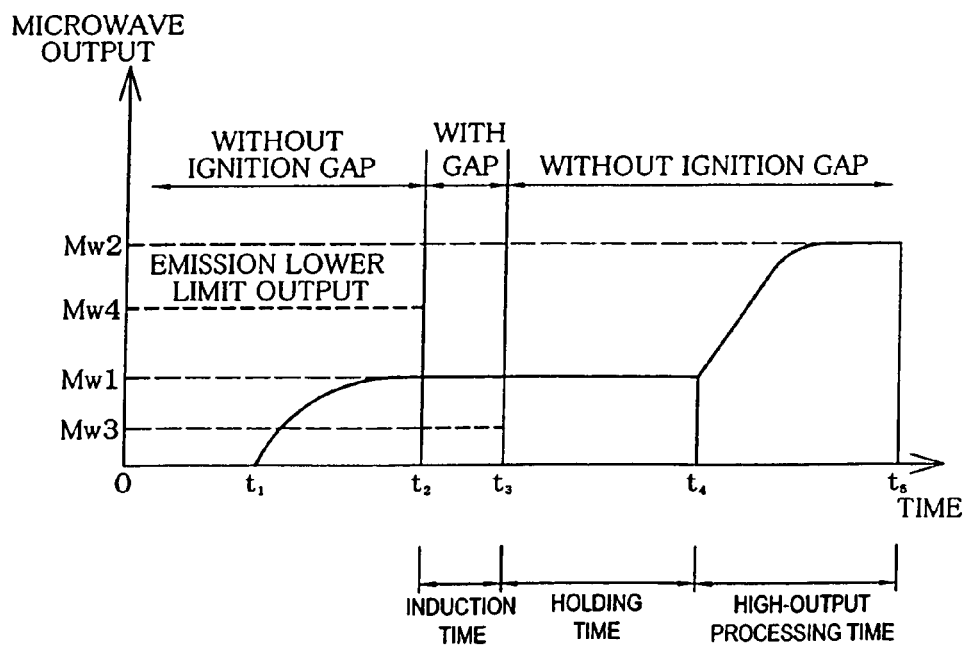
FIG. 8 is a view illustrating another control example of the microwave output and the ignition gap in the plasma processing method using the microwave plasma processing device according to the second embodiment of the present invention.

FIG. 8 is a view illustrating another control example concerning the control of the microwave output of the ignition gap in the plasma processing method according to this embodiment.

In this embodiment, the step until introduction of the plasma is the same as the above-described processing step except that the ignition gap 146 is not provided.

In this processing step, since the ignition gap 146 is not provided before starting introduction of the microwave into the plasma processing chamber 1, a lower limit output (Mw4) with which plasma emission is possible in the plasma processing chamber 1 is high.

In this state, introduction of the microwave is started (t1). An output (Mw1) of the microwave which is introduced at a low output is a value which is higher than an emission lower limit output (Mw3) in case of providing the ignition gap 146 and lower than an emission lower limit output (Mw4) in case of providing no ignition gap 146. As a result, even when the microwave is introduced into the plasma processing chamber 1, plasma ignition is not performed, and the processing of the bottle 13 using the plasma is not started.

According to this method, a time of the entire step can be reduced by, e.g., overlapping a time required for start of the microwave oscillator 4 and a time required for sufficient gas replacement.

Then, after an output of the microwave reaches a set value (Mw1) and is stabilized, the ignition gap 146 is provided by moving down the sealing member fixing frame 145 in the longitudinal direction.

Consequently, as shown in FIG. 8, the plasma emission lower limit output in the plasma processing chamber 1 lowers from Mw4 to Mw3, and the plasma can be ignited even with the microwave output (Mw1) in a low-output state. Therefore, with a time point at which the ignition gap 146 is provided being determined as a starting point (t2), plasma ignition can be performed.

After entering the state in which the ignition gap 146 is provided, plasma emission is started after an induction time (t3).

Since a plasma ignition operation is carried out in a state where the microwave output is stabilized in this method, the induction time can be set to a fixed and shortest time. Therefore, in case of performing processing of, e.g., a plurality of bottles, a plasma processing time of each bottle can be set further constant, the qualities of the respective bottles can be further homogenized.

After starting plasma emission, the processing is carried out like the processing steps mentioned above.

As described above, according to the microwave plasma processing device of this embodiment, the time from introduction of the microwave into the plasma processing chamber to plasma emission can be shortened by providing and setting the plasma ignition gap between the microwave sealing member and the end surface of the bottle holding portion, and a plasma ignition start timing can be controlled by controlling presence/absence of the plasma ignition gap.

[Third Embodiment]

A plasma processing gas supply member according to a third embodiment of the present invention will now be described with reference to FIGS. 9 to 11.

This embodiment is an embodiment in which a gas supply pipe comprising a porous pipe having an aperture distribution in a lengthwise direction is used as a plasma processing gas supply member according to the present invention.

[Plasma Processing Gas Supply Member]

Figure 9:
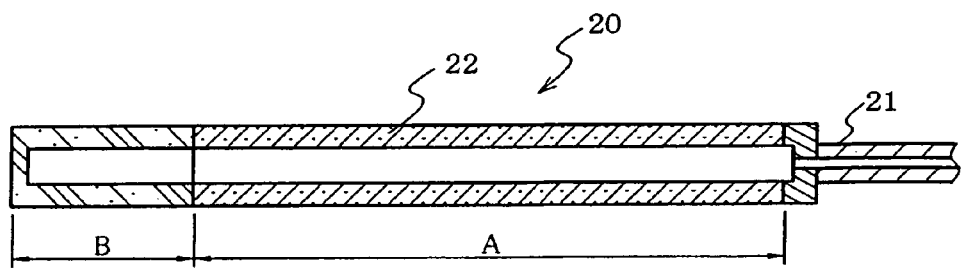
FIG. 9 is a cross-sectional side view showing a typical example of a plasma processing gas supply member according to a third embodiment of the present invention.

FIG. 9 shows a preferred typical example of a plasma processing gas supply member according to the third embodiment of the present invention. A gas supply member 20 shown in this drawing is, e.g., a gas supply member (see the processing gas supply member 15 depicted in FIGS. 2 and 3) which is used in such a plasma processing device as described in conjunction with the first and second embodiment, and comprises a hollow cylindrical supply shaft 21 and a hollow porous tubular portion 22 which is joined to an end of this cylindrical holding shaft 21 by, e.g., welding and has a closed end portion. Furthermore, a predetermined gas is supplied into the porous tubular portion 22 through a hollow portion of the cylindrical support shaft 21, and the gas is sprayed outwardly from a porous wall portion.

The porous tubular portion 22 has a reference area A having a predetermined aperture and a gas blowing quantity adjustment area B having an aperture smaller than that of the reference area A. As shown in FIG. 9, the gas blowing quantity adjustment area B is formed at an end portion of the gas supply member, and the reference area A is formed in an area other than this end portion.

Moreover, by placing the gas blowing quantity adjustment area B of this end portion at a position having a high electric field intensity in chemical plasma processing, a thickness of a plasma processing film formed at this position is adjusted, thereby forming the plasma processing film having an even thickness as a whole.

Here, taking formation of a plasma processing film on an inner surface of a plastic bottle as an example, it is preferable to set an aperture in the reference area A in such a manner that a nominal filtering accuracy falls in a range of 10 to 100 µm, especially 10 to 40 µm. That is, if the aperture in the reference area A is large more than necessary, a gas blowing quantity from the entire porous tubular portion 22 is increased, and hence there is the possibility that partially adjusting the gas blowing quantity by the gas blowing quantity adjustment area B is difficult and, further, if the aperture is small more than necessary, setting the balance of the aperture with the adjustment area is difficult, and hence a fixed thickness with respect to a film to be formed cannot be assured. It is to be noted that the nominal filtering accuracy is one of characteristic values used when a porous body is utilized as a filter, and, e.g., a nominal filtering accuracy 100 µm means that a foreign particle having the above-described particle diameter can be captured when this porous body is used for the filter.

Moreover, it is preferable for the aperture in the gas blowing quantity adjustment area B to have a size corresponding to 10 to 80% of the nominal filtering accuracy in the reference area A, e.g., the nominal filtering accuracy of approximately 5 to 30 µm. That is, the meaning of provision of the gas blowing quantity adjustment area B becomes subtle when the aperture of this area B is close to the aperture of the reference area A, and there is the possibility of a disadvantage, e.g., an extremely reduced thickness at a part corresponding to the adjustment area B when the aperture in the area B is too small as compared with the aperture of the reference area A.

Additionally, a length of the gas blowing quantity adjustment area B varies depending on an entire length or a diameter of the porous tubular portion B or the plasma processing device to which this gas supply member is applied and cannot be generally specified, but generally setting a length of 5 to 60 mm can suffice when performing the plasma processing on the inner surface of, e.g., a plastic bottle.

Further, in the example shown in FIG. 9, the gas blowing quantity adjustment area B is formed at the end portion of the porous tubular portion 22, but the adjustment area B can be formed at an arbitrary position corresponding to a part where an electric intensity is increased in accordance with a configuration or the like of the plasma processing device in place of the end portion.

Furthermore, although the aperture of the gas blowing quantity adjustment area B is set smaller than that of the reference area A in the above example, the area B may have an aperture larger than that of the reference area A in some cases. That is, when a part where an electric field intensity is considerably low exists because of a configuration or the like of the plasma processing device and a film having a predetermined thickness is hard to be formed at this part, a film having an even thickness as a whole can be formed by forming the adjustment area B having an aperture larger than that of the reference area A in accordance with this part.

It is to be noted that the porous tubular portion 22 may be formed of an arbitrary porous material as long as it includes the reference area A and the gas blowing quantity adjustment area B with predetermined apertures in this embodiment, but it is preferable for the porous tubular portion 22 to be formed of a porous metal, e.g., bronze power particles or stainless steel power particles in terms of facilitation of generation of plasma based on microwave glow discharge.

Moreover, in regard to the gas supply member according to this embodiment comprising such a porous tubular portion 22, it is good enough to mold and sinter rings having a predetermined aperture, then join them by, e.g., welding to be integrated, and further join the integrated ring to the cylindrical support shaft 21 by, e.g., welding. It is to be noted that the cylindrical support shaft 21 may be formed of an arbitrary material such as various kinds of metals or resins, but it is preferable to use the same kind of metal as that of the porous tubular portion 22 in order to facilitate occurrence of plasma by microwave glow discharge like the porous tubular portion 22.

Additionally, the porous tubular portion 22 may be formed of an arbitrary porous material, but holes can be formed through a non-porous metal pipe to provide the porous tubular portion 22, for example.

Further, if the porous tubular portion 22 is formed of a metal, since an electric field intensity distribution is generated along a longitudinal direction of this porous tubular portion 22 and a part having the maximum electric field intensity is generated in an area close to the end portion when performing the plasma processing, forming the gas blowing quantity adjustment area B at the end portion is most preferable as shown in FIG. 9.

Although the gas supply member according to this embodiment including the porous tubular portion 22 is most preferably used for formation of a chemical plasma processing film on an inner surface of a container, especially a plastic bottle, it is desirable to provide a chip having a gas discharge opening at the end of the porous tubular portion 22 in order to assure a film thickness at the bottom portion thereof in particular.

Figure 10:
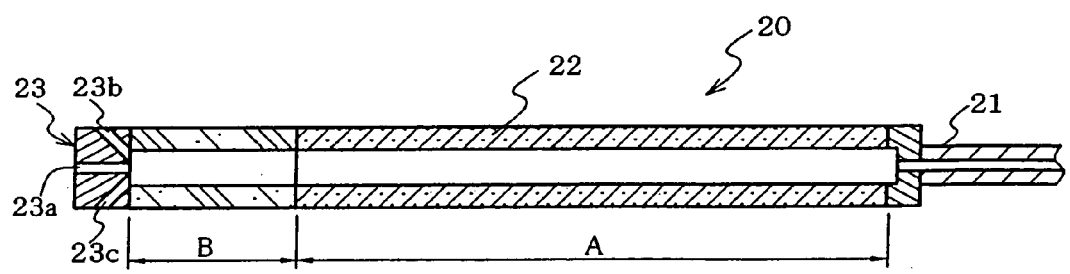
FIG. 10 is a cross-sectional side view showing another preferred example of the plasma processing gas supply member according to the third embodiment of the present invention.

FIG. 10 shows an example of the gas supply member comprising such a chip.

In this drawing, the end of the porous tubular portion 22 is opened, and a chip 23 is provided at this end. For example, gas discharge openings 23a, 23b and 23c communicating with the inside of the porous tubular portion 22 are formed through this chip 23, the discharge opening 23a straightly extends along the longitudinal direction of the porous tubular portion 22 to communicate with the outside, and the discharge openings 23b and 23c obliquely extend with respect to the longitudinal direction of the porous tubular portion 22 to communicate with the outside.

In case of inserting the gas supply member into the bottle and performing the plasma processing of the bottle inner surface, although a thickness of a processing film is reduced at the bottom portion of the bottle, the thickness of the processing film can be increased at the bottom portion of the bottle by adopting such a configuration as shown in FIG. 10. Namely, that is because a processing film forming gas supply quantity is increased by the gas discharge opening 23a at the center of the bottle bottom portion, and the processing film forming gas supply quantity is increased by the gas discharge openings 23b and 23c at a rim portion of the bottle bottom portion.

Incidentally, it is good enough to form such a chip 23 by using the same metal as that of the porous tubular portion 22. Furthermore, diameters, the number, a discharge direction or combinations of the gas discharge openings can be appropriately set based on a film thickness at the container bottom portion or the balance with the gas blowing quantity from the porous tubular portion.

[Plasma Processing Device and Method]

Although he gas supply member according to this embodiment having the above-described configuration can be applied to the microwave plasma processing or high-frequency plasma processing, it is most effective to apply this member to the microwave plasma processing to form a processing film on the inner surface of a plastic bottle.

For example, this member can be used as, e.g., the gas supply member (the processing gas supply member 15) of the microwave plasma processing device according to the present invention shown in FIGS. 1 to 3. In this case, the same plasma processing as that described in conjunction with the first and second embodiments is carried out under the same processing conditions. The container as a processing target, the processing gas and other processing conditions can be the same as those of the first and second embodiments.

Incidentally, in case of applying the gas supply member according to this embodiment to the microwave plasma processing device, it is preferable to specify a distance (D) between the microwave sealing member and the bottle fixing means, a connection position (H) of the microwave introducing means or a plasma ignition gap (G) such as those described in the first and second embodiments to predetermined values in the plasma processing device, but the gas supply member according to this embodiment can be used in the plasma processing device having no such specification of these values.

When the plasma processing is carried out by using the gas supply member according to this embodiment, a processing film having an even thickness with very small fluctuation band can be formed on, e.g., the inner surface of a bottle as described above, and a processing film having a thickness comparable to an inner surface of a trunk portion can be also formed on the bottle bottom-portion in case of using the gas supply member having the chip with predetermined gas discharge openings provided at the end thereof.

Figure 11:
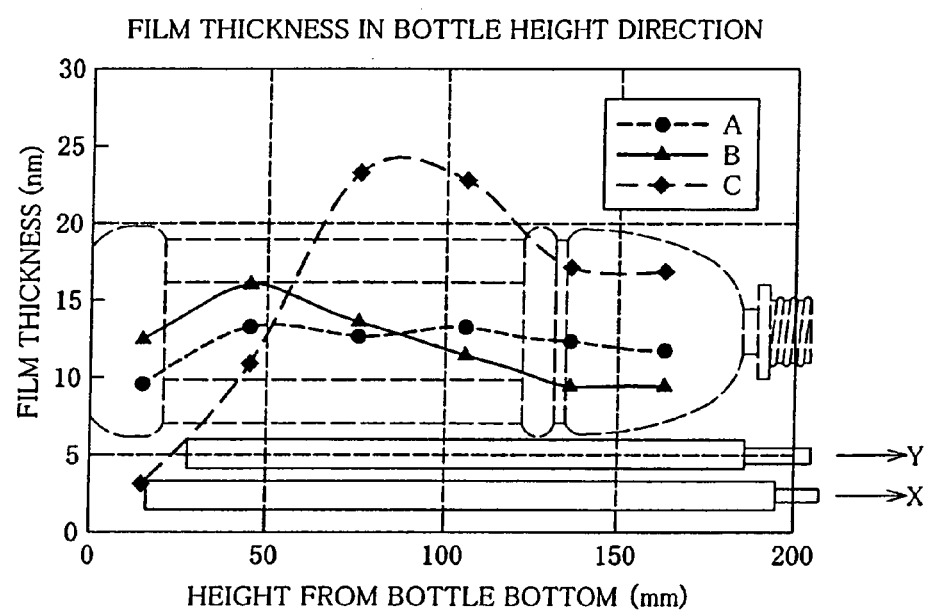
FIG. 11 is a graph showing a relationship between a thickness of a plasma processing film formed by microwave glow discharge and a height from a bottle bottom portion when a source gas is supplied into the bottle by using the plasma processing gas supply member according to the third embodiment of the present invention.

FIG. 11 shows a relationship between a thickness of the plasma processing film (a silicon oxide film) and a height from the bottle bottom, the plasma processing film being formed by microwave glow discharge caused by inserting the gas supply member according to this embodiment into the plastic bottle and supplying a source gas into the bottle. It is to be noted that an insertion position of the gas supply member is indicated by "X" or "Y" in FIG. 11, and the gas supply member is illustrated outside the bottle for the convenience's sake, but the gas supply member is actually arranged in the bottle.

In the illustrated example, a bottle which has an internal volume of 500 ml and is formed of polyethylene terephthalate is inserted into the plasma processing chamber (the chamber), 3 sccm of an organic siloxane compound gas and 30 sccm of an oxygen gas are supplied as the processing gas while maintaining 20 Pa in the bottle, and a microwave of 500 W is applied for six seconds while maintaining a part inside the plasma processing chamber and outside the bottle at 3000 Pa, thereby performing the chemical plasma processing.

Moreover, when a porous pipe having an aperture with a nominal filtering accuracy of 120 μm is inserted to a position indicated by Y as the gas supply member to perform the plasma processing, a thickness of a film formed on the inner surface of the bottle is approximately 25 nm at a central part of the bottle trunk portion and approximately 17 nm at a bottle shoulder portion as indicated by a curve C, the thickness is reduced from the central part of the bottle trunk portion to the bottom portion, a thickness is as small as approximately 3 nm on the inner surface of the bottom portion, and a fluctuation band of the film thickness is as large as approximately 22 nm.

Additionally, when an aperture (the nominal filtering accuracy) of the stainless pipe is 10 μm, a chip having a gas discharge opening of ϕ0.5 mm is provided at an axial center part of the end of the pipe in order to assure a film thickness at the bottle bottom portion, a length of the pipe is set to be an integral multiple of a half wavelength of the microwave to set the insertion position at a position indicated by X, and the pipe is deeply inserted to a position close to the bottom portion of the bottle to perform the plasma processing, a film thickness on the bottle inner surface is increased to approximately 12 nm at the bottle bottom portion as indicated by a curve B, and a fluctuation band of the film thickness is greatly reduced to approximately 7 nm, but a fluctuation band is not sufficiently reduced from the trunk portion to the shoulder portion of the bottle.

Thus, in accordance with this embodiment, when an end portion area (a 30 mm area from the end) of the stainless pipe is set to have a smaller aperture whose nominal filtering accuracy is 10 μm and the remaining area is determined as an area having the nominal filtering accuracy of 20 μm to perform the same plasma processing, approximately 10 nm of the film thickness is assured at the bottle bottom portion as indicated by a curve A, and the fluctuation band of the film thickness can be greatly reduced to approximately 3 nm.

That is, in case of performing the chemical plasma processing by using the metal gas supply member according to this embodiment, an electric field intensity becomes high and low along the gas longitudinal direction, and the electric field intensity becomes maximum in the vicinity of the end portion of the gas supply member. As a result, formation of the plasma is facilitated at the maximum level at a part where the electric field intensity becomes highest, thereby maximizing a thickness of the plasma processing film.

As described above, in this embodiment, the aperture of the porous pipe used as the chemical plasma processing gas supply member is distributed along the longitudinal direction, and the gas blowing quantity adjustment area with a smaller aperture is formed in accordance with such a part having the large electric field intensity as mentioned above for example, thereby reducing the maximum thickness and forming a plasma processing film having an even thickness as a whole with a small fluctuation band of the film thickness.

As described above, according to the plasma processing gas supply member of this embodiment, the porous pipe having an aperture distribution in the lengthwise direction is used as the gas supply member which supplies the processing gas into the plasma processing chamber of the plasma processing device, especially the porous pipe having the gas blowing quantity adjustment area in which an aperture is relatively small being formed at the end portion thereof is used, thereby forming a plasma processing film with an even thickness on an inner surface of a container as a processing target and an inner surface of a plastic bottle in particular.

[Fourth Embodiment]

A plasma processing gas supply member according to a fourth embodiment of the present invention will now be described with reference to FIGS. 12 to 16.

This embodiment is an embodiment in which a gas supply member which is sectioned into a metal electric field intensity distribution stabilizing area and a non-metal end gas induction area is used as the plasma processing gas supply member according to the present invention.

[Plasma Processing Gas Supply Member]

FIG. 12 shows preferred typical examples of a plasma processing gas supply member according to the fourth embodiment of the present invention. A gas supply member 30 shown in this drawing is the same as the gas supply member 20 according to the third embodiment, e.g., a gas supply member (see the processing gas supply member 15 shown in FIGS. 2 and 3) used in the plasma processing device described in the first and second embodiments, and comprises a hollow cylindrical support shaft 31 and a gas supply pipe 32 joined to an end of this cylindrical support shaft 31 by, e.g., welding.

Specifically, the gas supply member 30 has a configuration in which a predetermined reactive gas (a plasma processing gas) is supplied into the gas supply pipe 32 through a hollow portion of the support shaft 31 and the gas is sprayed outwardly from a pipe wall portion and the end portion, and the reactive gas is supplied into a plasma processing area (the inside of a container) when this gas supply pipe 32 is inserted into a container (see the bottle 13 shown in FIGS. 2 and 3) held in, e.g., the plasma processing device depicted in FIGS. 1 to 3.

Furthermore, in this embodiment, the gas supply pipe 32 is configured to be sectioned into an electric field intensity distribution stabilizing area A and an end gas induction area B positioned on the end portion side of the area A.

In the example depicted in FIG. 12, the electric field intensity distribution stabilizing area A of the gas supply pipe 32 is formed of a metal porous pipe 32a, and has an effect of spraying the gas toward the periphery through a pipe wall thereof, supplying the gas into the container held in the plasma processing device, forming an excellent resonating system in the plasma processing area (the inside of the container), increasing an electric field intensity in a plasma processing area (the inside of the container) and stabilizing an electric field intensity distribution along an axial direction of the container to be processed. Therefore, in this area A, the gas supply pipe 32 must be a porous pipe and formed of a metal in order to supply the gas toward the periphery. When the pipe wall is formed of, e.g., a non-metal material, the above-described electric field intensity adjustment function cannot be demonstrated.

Moreover, in order to demonstrate the above-described electric field intensity adjustment function, the metal porous pipe 32a constituting this electric field intensity distribution adjustment area A is electrically connected with a shield wall constituting the plasma processing chamber, and an axial length of this pipe is set to have a definite relationship with respect to a half wavelength ($\lambda/2$) of the microwave used for the plasma processing. Therefore, although the axial length of the metal porous pipe 32a (the axial length of the electric field intensity distribution stabilizing area A) cannot be generally specified, this length is generally approximately 170 to 190 mm when a plastic bottle having a capacity of 500 ml is taken as an example.

In this embodiment, the metal porous pipe 32a may be formed of an arbitrary metal as long as the above-described electrical characteristics are assured, it is preferable for this pipe to be formed of bronze power particles or stainless steel power particles in terms of the moldability or the like.

Additionally, it is preferable for the metal porous pipe 32a to have an aperture with which the nominal filtering accuracy becomes 300 μm or below and falls within a range of 2 to 150 μm in particular in order to evenly supply the gas through the pipe wall.

Further, the metal porous pipe 32a may have a fixed aperture as a whole, the aperture may be distributed along the axial direction of this pipe. That is, when performing the plasma processing based on the microwave, the electric field intensity is distributed along the axial direction of the gas supply member (or the container), and the maximum electric field intensity part and the minimum electric field intensity part are alternately repeated with, e.g., a half wavelength ($\lambda/2$) of the microwave being determined as approximately one cycle, but the end portion of the metal porous pipe 32a becomes a singular point of electric field concentration and tends to have a large thickness. Therefore, in such a case, reducing the aperture at this part can further homogenize the thickness of the vapor deposition film to be formed along the axial direction, for example.

Such a metal porous pipe 32a can be formed by, e.g., forming and sintering rings having a predetermined aperture, then joining and integrating these rings by using welding or a screw configuration, and the obtained pipe can be also joined to the cylindrical support shaft 31 by welding, a screw configuration or the like.

In the example shown in FIG. 12, although the cylindrical support shaft 31 may be formed of various kinds of metal materials as long as communication with the shield wall constituting the plasma processing chamber can be obtained, it is preferable for the cylindrical support shaft 31 to be formed of the same metal as the porous metal constituting the metal porous pipe 32a.

Furthermore, the end gas induction area B is constituted of a non-metal pipe 32b consisting of an electrically insulating non-metal material. That is, this area B is formed in order to spray the gas toward the bottom portion of the container without adversely affecting the electric field intensity distribution stabilized by the area A. Therefore, a pipe wall of this non-metal pipe 32b may have an aperture like that of the metal porous pipe 32a, but the aperture may be not formed through the pipe wall as long as a through hole which communicates with the inside of the metal porous pipe 32a from the end thereof and pierces the end portion of the non-metal pipe 32b is formed.

Figure 12A:
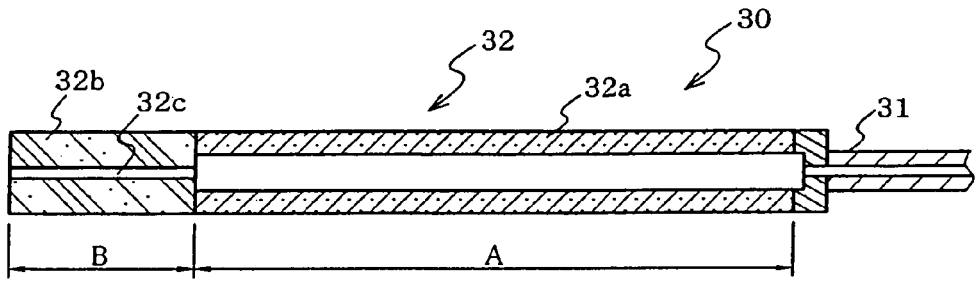
FIG. 12 is a cross-sectional side view showing a typical example of a plasma processing gas supply member according to a fourth embodiment of the present invention.
Figure 12B:
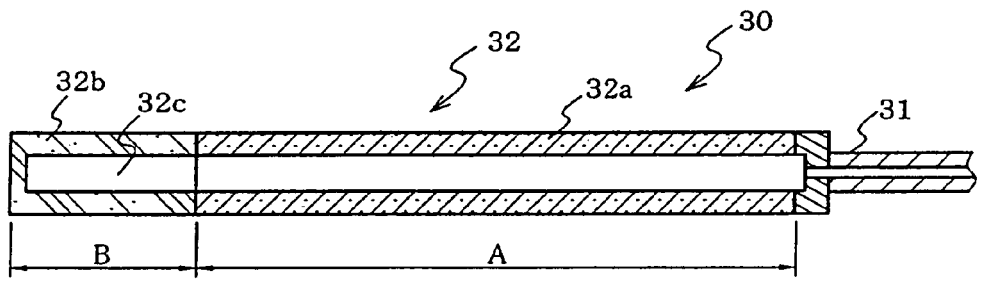

For example, the conformation shown in FIG. 12(a) is an example in which no aperture is formed through the pipe wall of the non-metal pipe 32b, and a through opening 32c communicating with the inside of the metal porous pipe 32a pierces the end of the non-metal pipe 32b in this case. On the other hand, the conformation shown in FIG. 12(b) is an example in which the aperture is formed through the pipe wall of the non-metal pipe 32b, and the end of the through opening 32c is closed by the pipe wall, but the aperture is formed through the pipe wall and there is no problem in spraying the reactive gas in this case.

There are various kinds of resins or ceramics as the non-metal material forming the non-metal pipe 32b, a fluorocarbon resin or ceramics such as alumina is preferable in terms of the heat resistance, the strength, a cost and others. This non-metal pipe 32b can be molded by a known method such as an injection molding method, an extrusion method, a compression molding method, a baking method, a cutting method or the like in accordance with a type of a material constituting this pipe, and the non-metal pipe 32b is joined to the end of the metal porous pipe 2a by using a screw configuration or an appropriate adhesive as required.

Since an axial length of the non-metal pipe 32b is determined in accordance with an axial length of the metal porous pipe 32a or an axial length of a container to which a CVD film should be formed and cannot be generally specified, and hence it usually falls within a range which is less than a half wavelength ($\lambda/2$) of the microwave. Namely, that is because a gap between the end of the metal porous pipe 32a and the container bottom portion is usually less than $\lambda/2$.

Furthermore, it is preferable that the axial length of this non-metal pipe 32b is set in such a manner that a gap between the this pipe and the container bottom portion becomes approximately 1 to 40 mm. That is, a thickness of the CVD film formed on the container bottom portion tends to be insufficient when this gap exceeds the above-described range, and a thickness of the CVD film formed along the periphery tends to be insufficient as compared with the central part of the bottom portion when the gap is smaller than the range.

It is to be noted that the gas supply member according to this embodiment is not restricted to the example shown in FIG. 12, and it is possible to adopt, e.g., a configuration depicted in FIG. 13. That is, although the metal part forming the electric field intensity distribution stabilizing area A is formed of the pipe wall in the gas supply member depicted in FIG. 12, the metal part is formed of a member completely different from the pipe wall in the example shown in FIG. 13, and this point is a significant difference.

Figure 13A:
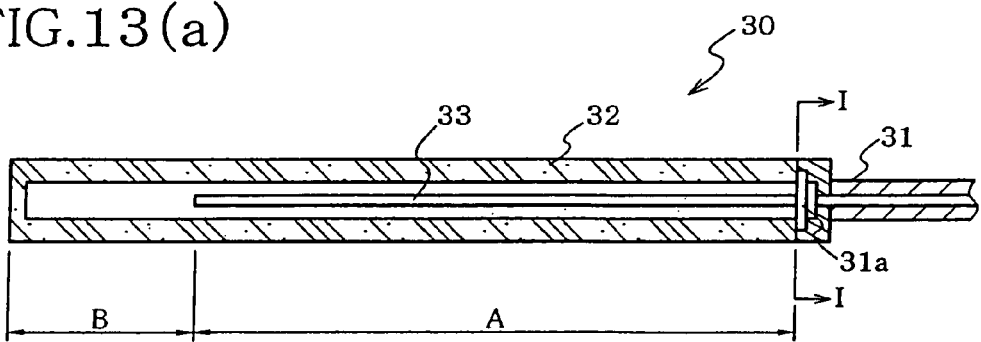
FIG. 13 is a cross-sectional side view showing another preferred example of the plasma processing gas supply member according to the fourth embodiment of the present invention.
Figure 13B:
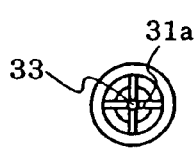

As shown in FIGS. 13(a) and (b), in this gas supply member, the entire gas supply pipe 32 joined to the end of the hollow cylindrical support shaft 31 is formed of the non-metal porous pipe, and a metal rod 33 (having the same electric field intensity distribution adjustment function as that of the metal porous pipe 32a in the gas supply pipe depicted in FIG. 12) which specifies the electric field intensity distribution stabilizing area A is provided in this gas supply pipe 32.

The metal rod 33 extends in the non-metal gas supply pipe 32 from a root portion thereof, and an area in which this metal rod 33 is provided serves as the electric field intensity distribution stabilizing area A, and an area beyond the end of this metal rod 33 (an area where the metal rod 33 is not provided) functions as the end gas induction area B.

In this example shown in FIG. 13, the entire non-metal gas supply pipe 32 is formed of the same non-metal material (e.g., a resin such as a fluorocarbon resin or ceramics such as alumina) as that of the non-metal pipe 32b depicted in FIG. 12, and the non-metal gas supply pipe 32 has the same aperture as that of the metal porous pipe 32a in the electric field intensity distribution stabilizing area A. That is, the aperture may not be formed in the end gas induction area B, and the axial length of the electric field intensity distribution stabilizing area A or the end gas induction area B can be set like the gas supply pipe depicted in FIG. 12.

Furthermore, since the metal rod 33 forms the electric field intensity distribution stabilizing area A, it must be electrically connected with the shield wall constituting the plasma processing chamber in the plasma processing device (see FIGS. 1 to 3). Therefore, in case of FIG. 13, the hollow cylindrical support shaft 31 is formed of a metal, and communication between the metal rod 33 and the shield wall constituting the plasma processing chamber must be achieved through this metal cylindrical support shaft 31. Therefore, a rod support portion 31a is provided at the end portion of the metal cylindrical support shaft 31 in such a manner that communication between the inner path of the support shaft 31 and the inside of the non-metal gas supply pipe 32 is not jeopardized, and the metal rod 33 is supported by this support portion 31a (see FIG. 13(b)).

It is to be noted that this metal rod 33 may be formed of an arbitrary metal material, it is preferable for the metal rod 33 to be formed of the same material as that of the metal porous pipe 32b in terms of the oxidation resistance.

[Plasma Processing Device and Method]

The gas supply member according to this embodiment having the above-described configuration is used as, e.g., the gas supply member of the microwave plasma processing device according to the present invention shown in FIGS. 1 to 3 like the gas supply member described in conjunction with the third embodiment. It is preferable to use processing steps or processing conditions which are the same as those described in the first and second embodiments.

It is to be noted that the gas supply member according to this embodiment can be also used in the plasma processing device according to the second embodiment in which the distance (D) between the microwave sealing member and the bottle fixing means, the connection position (H) of the microwave introducing means or the plasma ignition gap (G) is not specified like the third embodiment.

Figure 14A:
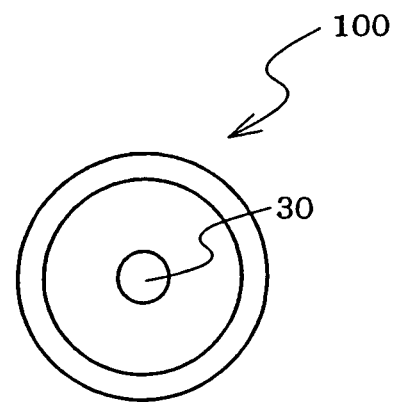
FIG. 14 is across-sectional plan view of a container trunk portion to which the plasma processing gas supply member according to the fourth embodiment of the present invention is applied.
Figure 14B:
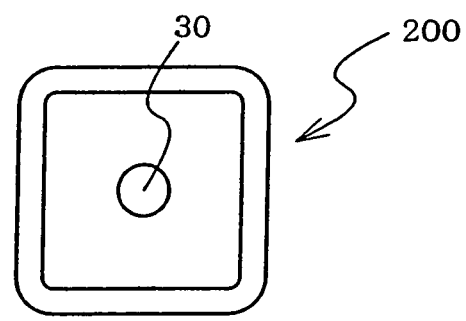

Here, a container subjected to the plasma processing by the gas supply member according to this embodiment may be a container 100 in which a planar cross-sectional shape of a trunk portion thereof is a circular axisymmetrical shape as shown in FIG. (14a), or may be a container 200 in which a planar cross-sectional shape of the same is a non-axisymmetrical shape like a rectangular shape shown in FIG. 14(b) and, in any case, an even CVD film having small irregularities in thickness along a circumferential direction can be formed on an inner surface of the trunk portion even in the container 200 having such a non-axisymmetrical shape as shown in FIG. 14(b) in particular by inserting the gas supply member 30 on an axial center of the container to form an excellent resonating system.

Moreover, in this embodiment, in order to form the excellent resonating system along the axial direction by the gas supply member 30 when performing the plasma processing based on supply of the microwave, increase the electric field intensity and stabilize the electric field intensity distribution along the axial direction, it is preferable to set a length of the electric field intensity distribution stabilizing area A, i.e., a length of the metal porous pipe 2a in such a manner that a length (see L shown in FIGS. 2 and 3) from the micro sealing member (see FIGS. 2 and 3) of the plasma processing chamber to a boundary portion between the electric field intensity distribution stabilizing area A and the end gas induction area B (corresponding to the end of the metal porous pipe 2a) becomes $(n\lambda/2)\pm 10$ mm (n is an integer not less than 1) with respect to the wavelength $\lambda$ of the microwave.

Additionally, in order to form a CVD film having a sufficient thickness on the bottom portion of the container and form a CVD film having an even thickness even in case of a container having a non-axisymmetrical shape such as shown in FIG. 14(b), it is preferable to set the axial length of the end gas induction area B in such a manner that a gap between the end of the gas supply pipe 32 and the container bottom portion becomes 1 to 40 mm.

By performing the plasma processing using the gas supply member 30 according to this embodiment in this manner, a processing film having a very small fluctuation band of a thickness and having an even thickness can be formed on an inner surface of the bottle.

As described above, according to the plasma processing gas supply member of this embodiment, by constituting the gas supply pipe on the end side of the gas supply member to be sectionalized in two areas, i.e., the metal electric field intensity distribution stabilizing area and the non-metal end gas induction area, the plasma processing area can be formed as the excellent resonating system, the electric field intensity of the plasma processing area can be increased, and the electric field intensity distribution can be also stabilized along the axial direction of the container to be processed. As a result, the plasma processing gas supplied from the gas supply member can be efficiently and evenly turned to the plasma, thereby forming a uniform thin film to a processing target.

[Embodiment]

Excellent advantages of the plasma processing gas supply member according to the fourth embodiment of the present invention will now be described hereinafter based on concrete experimental examples. Incidentally, it is needless to say that the gas supply member according to the present invention is not restricted to the following examples.

Common Conditions

Common conditions are determined as follows and experiments of respective examples were conducted.

A biaxial drawing prismatic bottle formed of polyethylene terephthalate whose cross-cross sectional shape has the oblateness of 1:1.3 was used as a substrate which is a processing target.

An organic silicon compound gas and oxygen were used as a processing source gas, and gas flow quantities were set to 2 sccm in case of the organic silicon compound gas and 20 sccm in case of oxygen.

Degrees of vacuum were determined as 20 Pa inside the bottle and 7000 Pa outside the bottle.

A microwave was oscillated by using a microwave power supply of 2.45 GHz, and processing was performed for 10 seconds at an output of 500 W after plasma ignition.

A. stainless pipe material (whose length is 35 mm: included in a length of a part A shown in Table 3) was used as the support portion of the gas supply member.

Evaluation of Film Thickness Distribution

By measuring a quantity of Si in a film at each measurement position cut out from a vapor deposition sample by using a fluorescent X-ray device manufactured by Rigaku Corporation and converting a measured result from an analytical curve into a film thickness, a film thickness distribution in a height direction (FIG. 15: a value at each height is an average value of circumferential four directions) and a difference (FIG. 16: a height position of 60 mm) between an average film thickness in 0 and 180° directions and an average film thickness in 90 and 270° directions were obtained.

EXPERIMENTAL EXAMPLES

In regard to a configuration or a length of the gas supply member, experiments were conducted based on combinations of conditions shown in Table 3. It is to be noted that a gas supply member which is entirely formed of a metal porous pipe was used as Comparative Example 1.

TABLE 3

Figure 15:
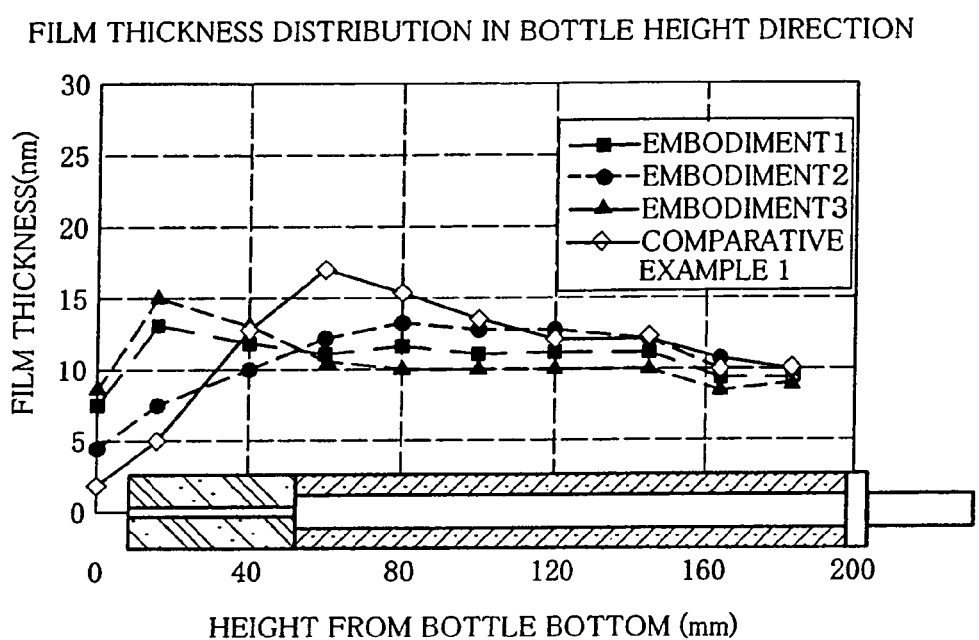
FIG. 15 is a graph showing an experimental result –1 (a film thickness distribution in a bottle height direction) using the plasma processing gas supply member according to the fourth embodiment of the present invention.

| Conditions | Configuration | Material Part A | Material Part B | Length mm Part A | Length mm Part B | Film thickness measurement result Height direction | Film thickness measurement result Circumferential direction |
|---|---|---|---|---|---|---|---|
| Embodiment 1 | FIG. 1(a) | SUS porous material | Fluorocarbon resin pipe with φ1 hole -see FIG. 15- | 180* | 40 | ◎ | ◎ |
| Embodiment 2 | | | | | 15 | ○ | ◎ |
| Embodiment 3 | FIG. 2 | SUS rod + ceramic porous pipe | Ceramic porous pipe | | 40 | ○ | ◎ |
| Comp. Example 1 | | SUS porous pipe | — | | 0 | X | X |

(part A: the electric field intensity distribution stabilizing area, part B: the end gas induction area)
(mark *: when the part A = 180 mm, a distance to the bottle bottom = 50 mm)

[Result-1]

It was confirmed from Table 3 and FIG. 15 that a film thickness is increased on the bottle bottom portion since the source gas reached the bottle bottom portion, and the rather large film thickness which is observed in Comparative Example 1 is improved in the vicinity of a position which is 40 to 100 mm of the trunk portion so that a film thickness difference (the maximum value—the minimum value) in the height direction becomes small under all experimental conditions (Embodiments 1 to 3) satisfying claims of the present invention. Incidentally, it can be considered that the large film thickness at the trunk portion observed in Comparative Example 1 is improved by provision of the end gas induction area because the flow quantity balance of the bottom portion and the trunk portion is enhanced when the source gas having a fixed supply quantity is partially led to the bottom portion.

[Result-2]

Figure 16:
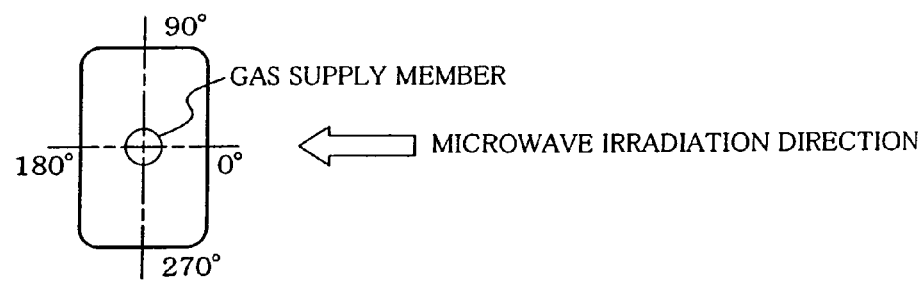
FIG. 16 is a graph showing an experimental result –2 (a film thickness difference in a bottle circumferential direction) using the plasma processing gas supply member according to the fourth embodiment of the present invention.
Figure 16:
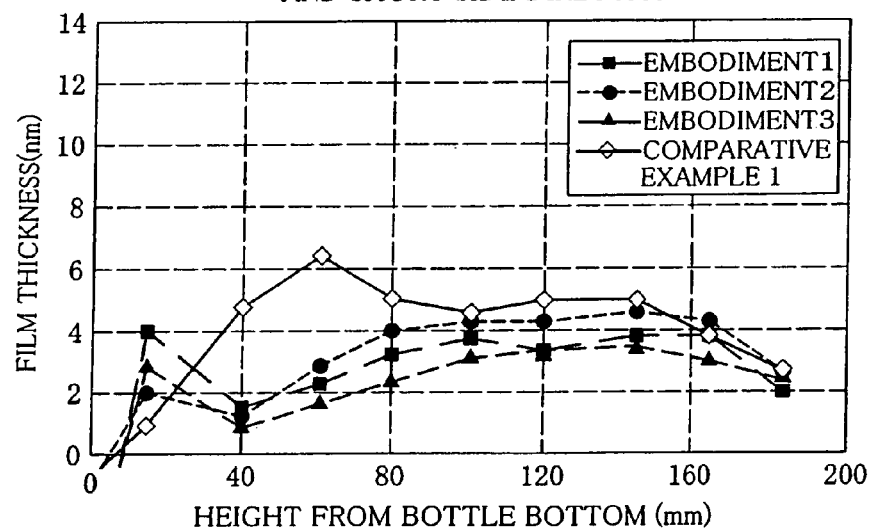

It was confirmed from Table 3 and FIG. 16 that a film thickness difference between the long side portion (0 and 180° directions) and the short side direction (90 and 270° directions) is large under the conditions of Comparative Example 1 in which the end gas induction area is not provided, whereas this is improved under the experimental conditions (Embodiments 1 to 3) satisfying claims of the present invention.

INDUSTRIAL APPLICABILITY

As described above, the microwave plasma processing device and the plasma processing gas supply member according to the present invention are useful as a plasma processing device and a gas supply pipe which can stably and efficiently generate plasma, and they are suitable for microwave plasma processing in particular.

The disclosure of Japanese Patent Applications No. 2003-066911, filed on Mar. 12, 2003; No. 2003-101616, filed on Apr. 4, 2003; No. 2003-106517, filed on Apr. 10, 2003; No. 2003-130761, filed on May 8, 2003; and No. 2003-297272, filed on Aug. 21, 2003 are incorporated in the application.

While the invention has been explained with reference to the specific embodiments of the invention, the explanation is illustrative and the invention is limited only by the appended claims.

What is claimed is:

1. A microwave plasma processing device comprising:

fixing means for fixing a substrate as a processing target on a central axis in a plasma processing chamber;

exhausting means for depressurizing an inside and outside of the substrate from a mouth portion;

a metal processing gas supply member which is present in the substrate and forms a reentrant cylindrical resonating system along with the plasma processing chamber; and microwave introducing means forming a predetermined node of an electric field intensity distribution with a node of a low electric field intensity distribution, the microwave introducing means being present at a side of the plasma processing chamber and at a height that the node of the low electric field intensity distribution is present, and introducing a microwave into the plasma processing chamber from the side of the plasma processing chamber against the node of the low electric field intensity distribution to perform processing, wherein a microwave sealing member is provided at a substrate-holding portion of the fixing means and directly below the fixing means such that the microwave sealing member covers the exhausting means, and a connection position of the microwave introducing means is located at the predetermined node which shows the low electric field intensity formed along with the processing gas supply member by introducing the microwave, a distance D between the microwave sealing member and a surface of the fixing means is 0 to 55 mm, and a distance L between the microwave sealing member and an end portion of the processing gas supply member satisfies when 0≤D≤20, $$L=(n\lambda/2+\lambda/8)-3+\alpha,$$

when 20≤D≤35, $$L=(n\lambda/2+\lambda/8)-(0.060D^2+4.2D-57)+\alpha,$$

and
when 35≤D≤55, $$L=(n\lambda/2+\lambda/8)-(0.030D^2+2.1D-21)+\alpha,$$

where n is an integer,

λ is a wavelength of the microwave, and

α is a fluctuation band in consideration of an influence and the like of the substrate on an electric field and is ±10 mm.

2. The microwave plasma processing device according to claim 1, further comprising a microwave oscillator for oscillating the microwave, the microwave being introduced to the processing chamber through the microwave introducing means to thereby form the node of the electric field intensity distribution, said microwave introducing means being connected to the processing chamber at a position where the node is formed.

3. A microwave plasma processing device comprising:

fixing means for fixing a substrate as a processing target on a central axis in a plasma processing chamber;

exhausting means for depressurizing an inside and outside of the substrate;

a metal processing gas supply member which is present in the substrate and forms a reentrant cylindrical resonating system along with the plasma processing chamber; and microwave introducing means forming a predetermined node of an electric field intensity distribution with a node of a low electric field intensity distribution, the microwave introducing means being present at a side of the plasma processing chamber and at a height that the node of the low electric field intensity distribution is present, and introducing a microwave into the plasma processing chamber from the side of the plasma processing chamber against the node of the low electric field intensity distribution to perform processing, wherein a microwave sealing member different from the fixing means is formed on an end surface of a substrate-holding portion and directly below the fixing means such that the microwave sealing member covers the exhausting means, and a plasma ignition gap is formed between an end surface of the substrate and the microwave sealing member to generate plasma in the gap, a distance D between the microwave sealing member and a surface of the fixing means is 0 to 55 mm, and a distance L between the microwave sealing member and an end portion of the processing gas supply member satisfies when $0 \leq D \leq 20$, $$L = (n\lambda/2 + \lambda/8) - 3 + \alpha,$$

when $20 \leq D \leq 35$, $$L = (n\lambda/2 + \lambda/8) - (0.060D^2 + 4.2D - 57) + \alpha,$$

and when $35 \leq D \leq 55$, $$L = (n\lambda/2 + \lambda/8) - (0.030D^2 + 2.1D - 21) + \alpha,$$

where n is an integer, $\lambda$ is a wavelength of the microwave, and $\alpha$ is a fluctuation band in consideration of an influence and the like of the substrate on an electric field and is $\pm 10$ mm.

4. The microwave plasma processing device according to claim 3, wherein the microwave sealing member and the substrate-holding portion are formed relatively movable to the plasma processing device forming the microwave reentrant cylindrical resonating system, and the plasma ignition gap between the microwave sealing member and the end surface of the substrate-holding portion is adjusted by relatively moving the microwave sealing member and the substrate-holding portion.

5. The microwave plasma processing device according to claim 1, wherein a distance H between the microwave searing member and the connection position of the microwave introducing means satisfies $$H = L - (n_2\lambda/2 + \lambda/8 - 3) + \beta \text{ (mm)},$$

where $n_2$ is an integer satisfying $n_2 \leq n_1 - 1$, $\lambda$ is a wavelength of the microwave, and $\beta$ is a fluctuation band caused due to a dimension or the like of the substrate and is $\pm 10$ mm.

6. The microwave plasma processing device according to claim 3, wherein a distance H between the microwave searing member and the connection position of the microwave introducing means satisfies $$H = L - (n_2\lambda/2 + \lambda/8 - 3) + \beta \text{ (mm)},$$

where $n_2$ is an integer satisfying $n_2 \leq n_1 - 1$, $\lambda$ is a wavelength of the microwave, and $\beta$ is a fluctuation band caused due to a dimension or the like of the substrate and is $\pm 10$ mm.

* * * * *